(12) United States Patent
Yanagi et al.

(10) Patent No.: US 11,415,647 B2
(45) Date of Patent: Aug. 16, 2022

(54) MAGNETIC FIELD GENERATOR AND NUCLEAR MAGNETIC RESONANCE APPARATUS

(71) Applicants: AISIN SEIKI KABUSHIKI KAISHA, Kariya (JP); JEOL Ltd., Akishima (JP)

(72) Inventors: Yosuke Yanagi, Kariya (JP); Yoshitaka Ito, Kariya (JP); Takashi Nakamura, Wako (JP); Hiroaki Utsumi, Hachioji (JP)

(73) Assignees: AISIN SEIKI KABUSHIKI KAISHA, Kariya (JP); JEOL Ltd., Akishima (JP)

( * ) Notice: Subject to any disclaimer, the term of this patent is extended or adjusted under 35 U.S.C. 154(b) by 290 days.

(21) Appl. No.: 16/738,072

(22) Filed: Jan. 9, 2020

(65) Prior Publication Data
US 2020/0225300 A1    Jul. 16, 2020

(30) Foreign Application Priority Data
Jan. 10, 2019    (JP) .............................. JP2019-002693

(51) Int. Cl.
*G01R 33/00*    (2006.01)
*G01R 33/34*    (2006.01)
(Continued)

(52) U.S. Cl.
CPC ... *G01R 33/34023* (2013.01); *G01R 33/3403* (2013.01); *G01R 33/3804* (2013.01);
(Continued)

(58) Field of Classification Search
CPC .............. G01R 33/543; G01R 33/5608; G01R 33/5607; G01R 33/4828; G01R 33/4835;
(Continued)

(56) References Cited

U.S. PATENT DOCUMENTS 6,489,769 B2    12/2002  Nakamura et al.
7,728,592 B2 *   6/2010  Ma ..................... G01R 33/3415
                                                   324/318
(Continued)

FOREIGN PATENT DOCUMENTS

JP    2002-006021 A    1/2002
JP    2014-053479 A    3/2014
(Continued)

OTHER PUBLICATIONS

Itoh, Y, et al., "Improved Magnetic-Field Homogeneity of NMR HTS Bulk Magnet using a New Stacking Structure and Insertion of an HTS Film Cylinder into a Bulk Bore", Teion Kogaku (J. Cryo. Super. Soc. Jpn), vol. 52, No. 1, 2017, pp. 25-32 (with English Abstract).

*Primary Examiner* — Jermele M Hollington
*Assistant Examiner* — Taqi R Nasir
(74) *Attorney, Agent, or Firm* — Oblon, McClelland, Maier & Neustadt, L.L.P.

(57) ABSTRACT

A magnetic field generator includes a refrigerating machine, a cold head, a superconductor which is formed in a cylindrical shape, a cold head extension portion which extends from the cold head and is brought into thermal contact with the superconductor at its extended end; and a vacuum heat insulating container having an internal space in which the cold head, the cold head extension portion, and the superconductor are received. The superconductor has a room temperature bore space, which is formed on its inner peripheral side along an axial direction of the superconductor, and is spatially isolated from the internal space of the vacuum heat insulating container. The room temperature bore space has both ends communicating to an outside of the magnetic field generator.

7 Claims, 18 Drawing Sheets

(51) Int. Cl.
  *G01R 33/38* (2006.01)
  *G01R 33/3815* (2006.01)
  *H01F 6/04* (2006.01)
  *H01F 5/00* (2006.01)

(52) U.S. Cl.
  CPC ........... *G01R 33/3815* (2013.01); *H01F 5/00* (2013.01); *H01F 6/04* (2013.01)

(58) Field of Classification Search
  CPC .......... G01R 33/3415; G01R 33/34023; G01R 33/3403; G01R 33/3804; G01R 33/3815; G01R 33/283; G01R 33/307; G01R 33/60; G01R 33/50; G01V 3/32; E21B 49/08; E21B 2049/085; G01N 24/10; H01F 5/00; H01F 6/04
  See application file for complete search history.

(56) References Cited

U.S. PATENT DOCUMENTS

| | | | | |
|---|---|---|---|---|
| 8,593,146 | B2* | 11/2013 | Gao | G01R 33/3858 324/318 |
| 9,564,262 | B2 | 2/2017 | Ito et al. | |
| 2002/0000806 | A1 | 1/2002 | Nakamura et al. | |
| 2002/0130747 | A1* | 9/2002 | Ito | H01F 6/00 335/299 |
| 2015/0369885 | A1* | 12/2015 | Ito | G01R 33/3815 324/309 |

FOREIGN PATENT DOCUMENTS

| | | |
|---|---|---|
| JP | 2016-006825 A | 1/2016 |
| JP | 2017-183480 A | 10/2017 |
| JP | 2019-090702 A | 6/2019 |

* cited by examiner

MAGNETIC FIELD GENERATOR AND NUCLEAR MAGNETIC RESONANCE APPARATUS

CROSS REFERENCE TO RELATED APPLICATION

This application is based on and claims priority under 35 U.S.C § 119 to Japanese Patent Application No. 2019-2693 filed on Jan. 10, 2019 the entire content of which is incorporated herein by reference.

TECHNICAL FIELD

This disclosure relates to a magnetic field generator and a nuclear magnetic resonance apparatus.

BACKGROUND DISCUSSION

Nuclear magnetic resonance (NMR) is a resonance phenomenon of nuclear spin (magnetic moment) generated when an electromagnetic wave (radio wave) having a natural frequency is applied to the atomic nucleus of a sample placed in a static magnetic field. A nuclear magnetic resonance apparatus (NMR apparatus) is an apparatus configured to detect the above-mentioned resonance phenomenon as an NMR signal (NMR spectrum) to analyze the structure of a sample. The sensitivity and the resolution of the NMR signal increase as a magnetic field strength increases, and hence the NMR apparatus is provided with a magnetic field generator (also referred to as "magnetic pole") configured to generate a strong magnetic field.

In order to generate a strong magnetic field, a bulk superconductor may be used in the magnetic field generator. In this case, it is preferred to use a bulk superconductor (superconducting bulk) made of a type-II superconductor, which is high in superconducting transition temperature and relatively easy to cool.

In Japanese Patent Application Laid-open No. 2002-006021, there is disclosed a magnetic field generator using a cylindrical-shaped superconducting bulk. According to this magnetic field generator, a vacuum heat insulating container in which a superconducting bulk is received is designed such that a room temperature bore space in which a measurement sample is to be placed can be secured in a space defined by the inner periphery of the cylindrical-shaped superconducting bulk. The cylindrical-shaped superconducting bulk is placed above a cold head of a refrigerating machine. Therefore, cooling energy generated by the refrigerating machine is transmitted to the superconducting bulk through the cold head, and the superconducting bulk is cooled to a temperature equal to or lower than the superconducting transition temperature. The superconducting bulk cooled to the temperature equal to or lower than the superconducting transition temperature captures an external magnetic field, to thereby generate a magnetic field. The magnetic field generated in this manner converts the room temperature bore space into a static magnetic field space.

By cooling the superconductor by the refrigerating machine as in the magnetic field generator described in Japanese Patent Application Laid-open No. 2002-006021, it is possible to cool the superconductor to a temperature equal to or lower than the superconducting transition temperature without using liquid helium or another such cryogen. This can contribute to downsizing of the nuclear magnetic resonance apparatus.

According to the magnetic field generator disclosed in Japanese Patent Application Laid-open No. 2002-006021, the cold head of the refrigerating machine is arranged below the superconductor. The cold head is arranged in the entire lower region of the superconductor, and the lower region of the room temperature bore space formed on the inner peripheral side of the superconductor is closed by the cold head. Therefore, when this magnetic field generator is incorporated into an NMR apparatus, in order to arrange a sample tube containing a measurement sample and a detection unit (probe unit) configured to detect an NMR signal in the room temperature bore space, it is required to insert the sample tube and the detection unit into the room temperature bore space from the upper end of the room temperature bore space. In this case, when the sample tube is inserted into the room temperature bore space from the upper end of the room temperature bore space, a considerable portion of a space on the upper end side of the room temperature bore space is occupied by the inserted sample tube, and hence a limitation is imposed on the size of the detection unit that can be inserted later into the room temperature bore space from the upper end.

The detection unit includes a detection coil configured to detect an NMR signal and a tuning circuit configured to obtain a resonance signal of the NMR signal detected by the detection coil. Of those, the detection coil is required to be arranged in the vicinity of the measurement sample, and is therefore arranged in the room temperature bore space. Meanwhile, the tuning circuit is relatively large, and therefore cannot be inserted into the room temperature bore space due to interference with the sample tube even when an attempt is made to insert the tuning circuit into the room temperature bore space from the upper end of the room temperature bore space. In short, the tuning circuit cannot be inserted into the room temperature bore space from its end portion on the side from which the sample tube has been inserted.

Alternatively, when the sample tube is inserted after the tuning circuit is inserted into the room temperature bore space, the tuning circuit can be inserted without interfering with the sample tube. However, in this case, it is impossible to secure, in the room temperature bore space, a space for leading a guide wire or other such operation means, which is connected to the tuning circuit in order to externally operate the tuning circuit inserted into the room temperature bore space, from the upper end side of the room temperature bore space to the outside. In other words, even when it is possible to arrange the tuning circuit in the room temperature bore space, the tuning circuit cannot be operated. Therefore, the tuning circuit is hitherto arranged outside the room temperature bore space. For example, the tuning circuit is arranged in the upper part of the magnetic field generator.

When the tuning circuit is arranged outside the room temperature bore space, a distance between the detection coil and the tuning circuit increases. Along with this increase, the length of a transmission line that electrically connects the detection coil and the tuning circuit to each other increases. Meanwhile, the tuning circuit includes a variable capacitor configured to adjust the sensitivity of an NMR signal, and adjusts the capacitance of the variable capacitor, to thereby adjust the sensitivity of the NMR signal. However, as the length of the transmission line connecting the detection coil and the tuning circuit to each other becomes longer, the stray capacitance of the transmission line increases, which exerts an adverse influence on the adjustment of the sensitivity of the NMR signal. As a result, the sensitivity of the NMR signal deteriorates.

Thus, a need exists for a magnetic field generator which is not susceptible to the drawback mentioned above.

SUMMARY

According to an aspect of this disclosure, there is provided a magnetic field generator including: a refrigerating machine configured to generate cooling energy; a cold head, through which the cooling energy generated by the refrigerating machine is to be transmitted; a superconductor, which is formed in a cylindrical shape, and is configured to generate a magnetic field by capturing a magnetic field under a state in which the superconductor has been cooled to a temperature equal to or lower than a superconducting transition temperature; a cold head extension portion, which extends from the cold head, and is brought into thermal contact with the superconductor at its extended end; and a vacuum heat insulating container having an internal space in which the cold head, the cold head extension portion, and the superconductor are received. Further, the superconductor has a room temperature bore space, which is formed on its inner peripheral side along an axial direction of the superconductor, and is spatially isolated from the internal space. Further, the room temperature bore space has both ends communicating to an outside of the magnetic field generator.

BRIEF DESCRIPTION OF THE DRAWINGS

The forgoing and additional features and characteristics of this disclosure will become more apparent from the following detailed description considered with the reference to the accompanying drawings, wherein.

DESCRIPTION OF THE EMBODIMENTS

First Embodiment

Figure 1:
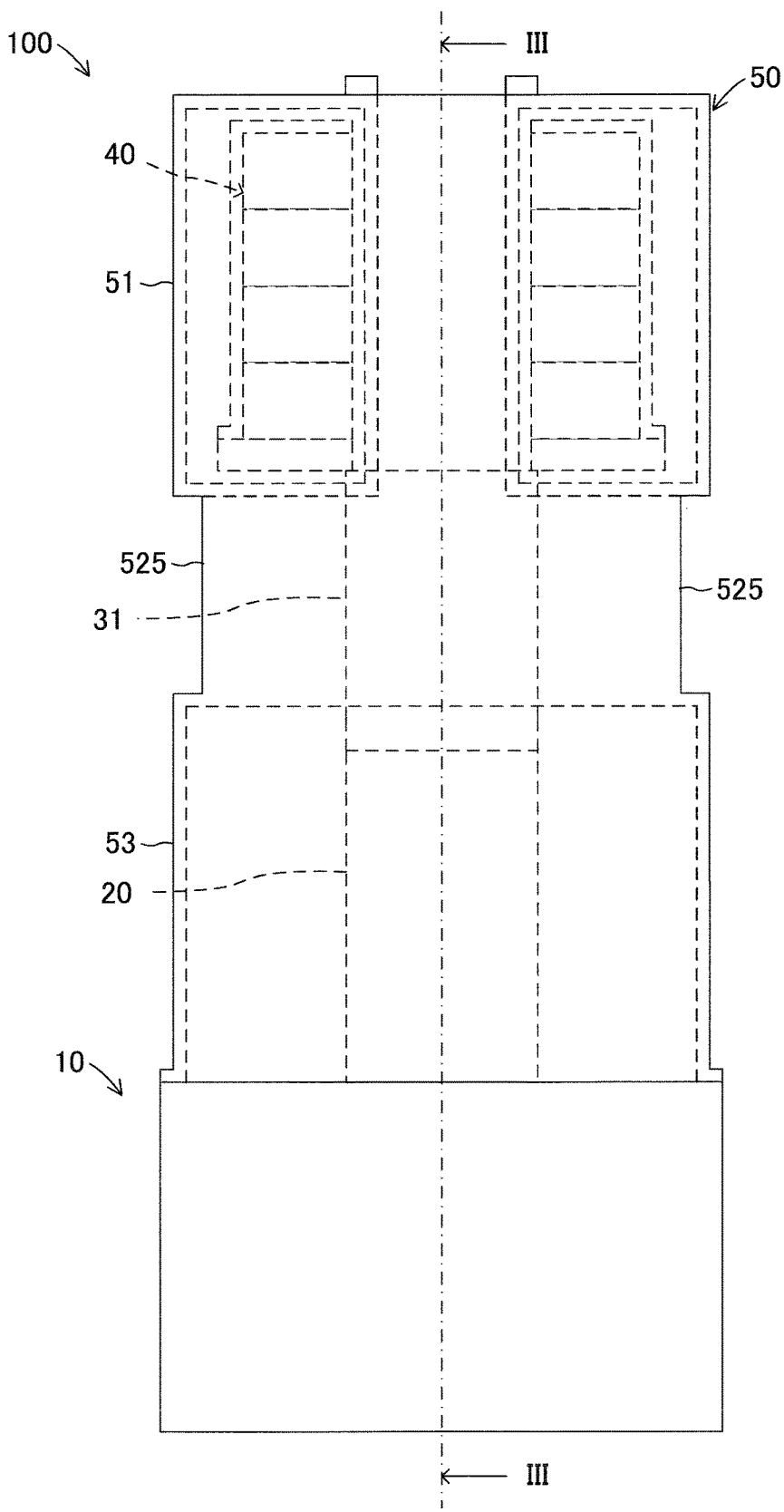
FIG. 1 is a side view of a magnetic field generator according to a first embodiment disclosed here.
Figure 2:
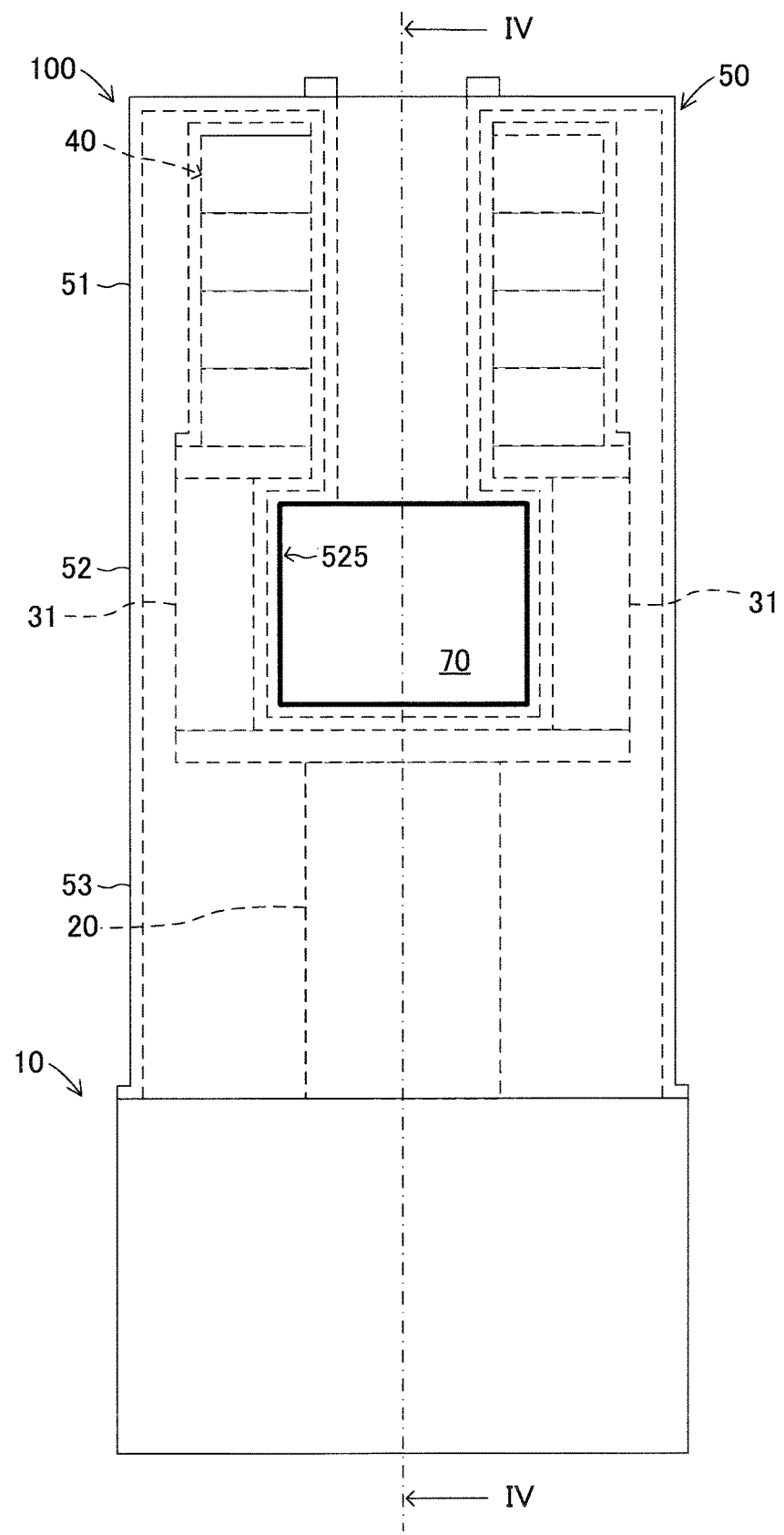
FIG. 2 is a front view of the magnetic field generator according to the first embodiment.

FIG. 1 is a side view of a magnetic field generator 100 according to a first embodiment, and FIG. 2 is a front view of the magnetic field generator 100. As illustrated in FIG. 1 and FIG. 2, the magnetic field generator 100 includes a refrigerating machine 10, a cold head 20, a pair of rod-shaped extension portions 31 and 31 serving as a cold head extension portion, a superconductor 40, and a vacuum heat insulating container 50.

The refrigerating machine 10 has a function of generating cooling energy. Examples of the refrigerating machine 10 include a Gifford-McMahon (GM) refrigerator, a Stirling refrigerator, and a pulse tube refrigerator.

Figure 3:
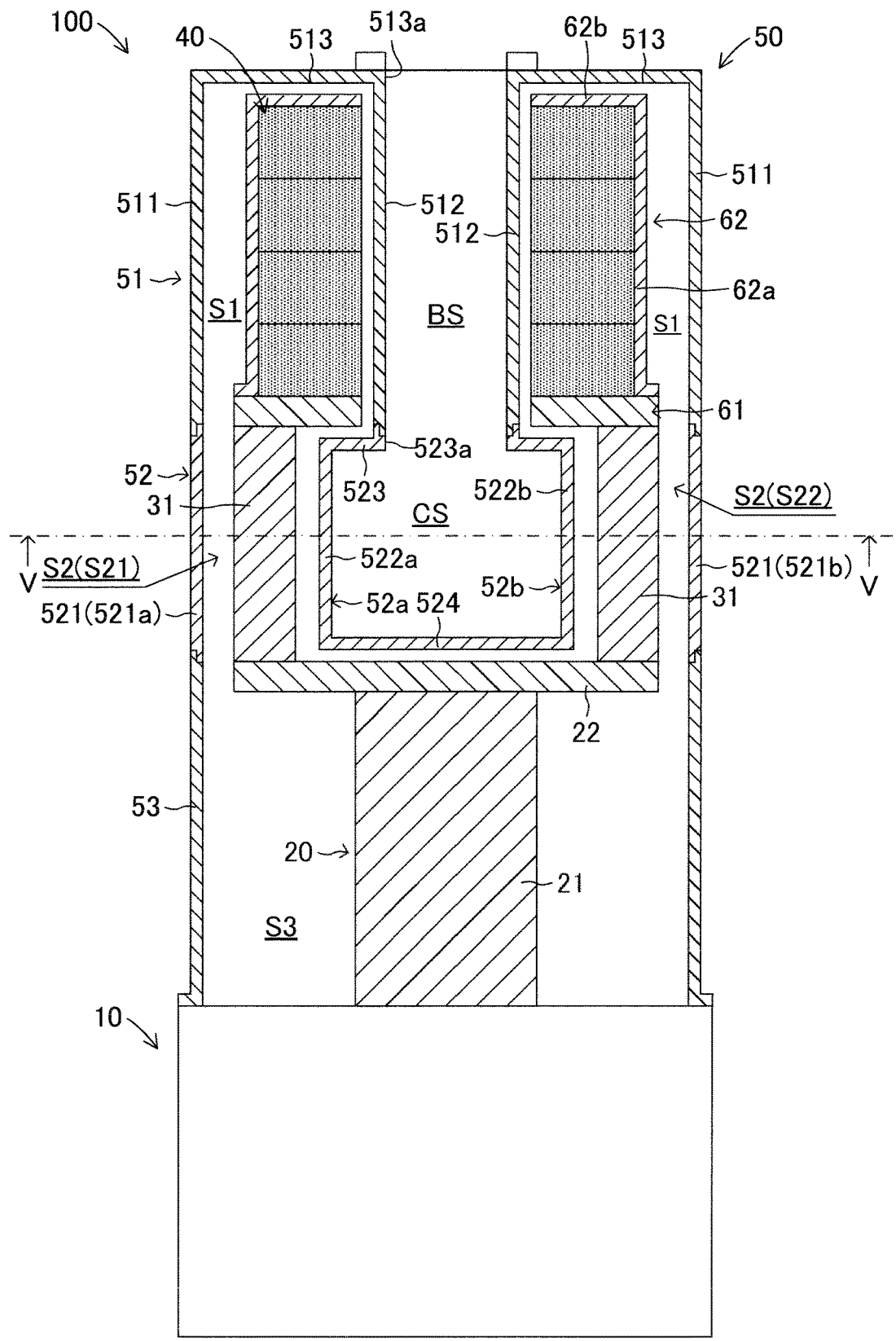
FIG. 3 is a cross-sectional view taken along the line of FIG. 1.
Figure 4:
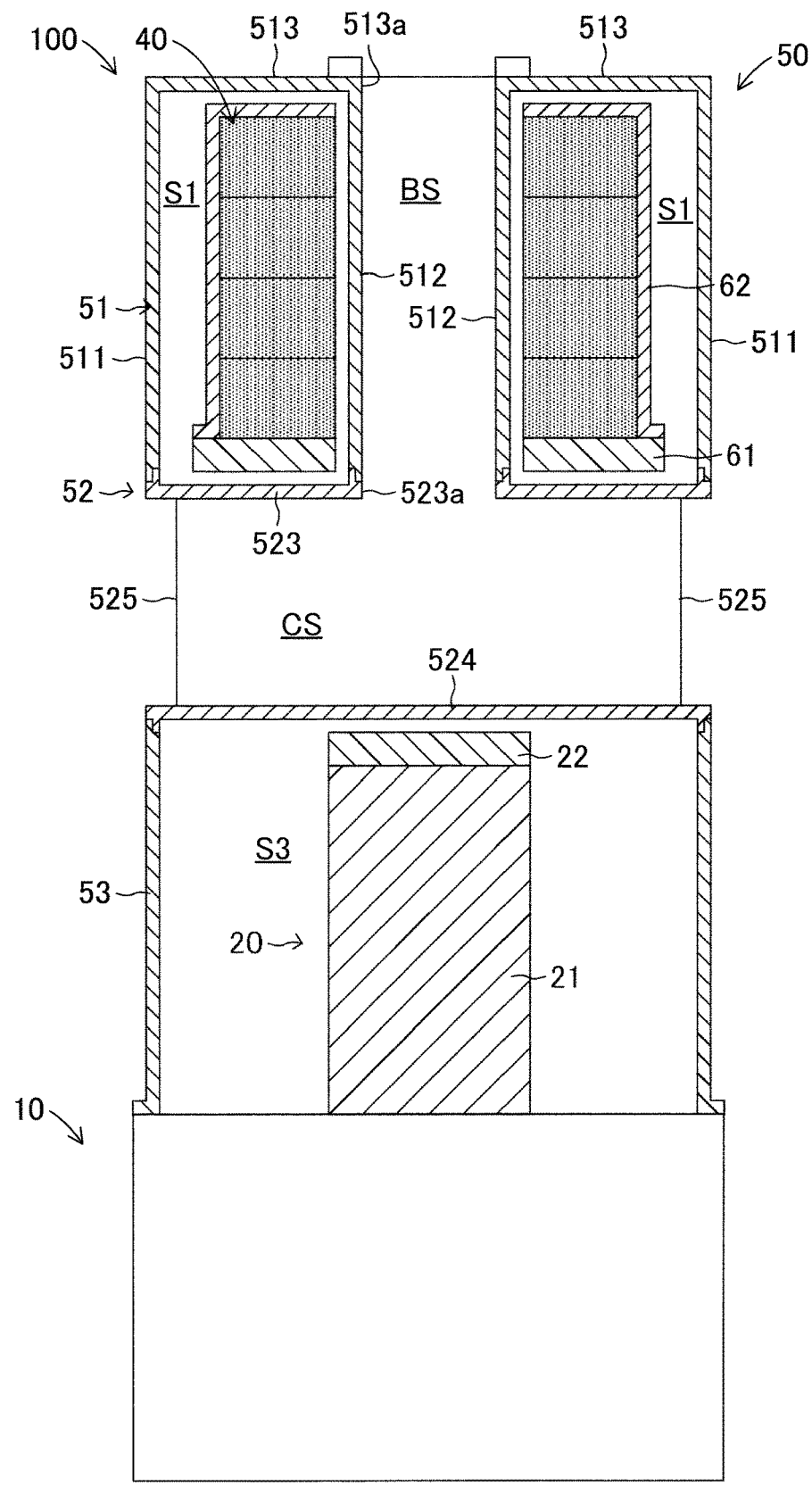
FIG. 4 is a cross-sectional view taken along the line IV-IV of FIG. 2.

FIG. 3 is a cross-sectional view taken along the line III-III of FIG. 1, and FIG. 4 is a cross-sectional view taken along the line IV-IV of FIG. 2. As better illustrated in FIG. 3, a cold head 20 is mounted to the upper part of the refrigerating machine 10. The cold head 20 is made of a material having a satisfactory thermal conductivity, for example, copper, and transmits the cooling energy generated by the refrigerating machine 10 to the cold head 20. The cold head 20 includes a cylindrical portion 21 and a stage portion 22. The cylindrical portion 21 has its lower end surface connected to a low-temperature generator (not shown) provided to the upper part of the refrigerating machine 10, and extends upward from the upper part (low-temperature generator) of the refrigerating machine 10. The stage portion 22 is connected to the upper end of the cylindrical portion 21. The stage portion 22 exhibits a flat plate shape whose thickness direction matches the up-down direction.

The pair of rod-shaped extension portions 31 and 31 serving as the cold head extension portion are connected onto the stage portion 22 of the cold head 20. The pair of rod-shaped extension portions 31 and 31 are arranged at both side end portions of the stage portion 22 in FIG. 3, respectively, and extend upward from the stage portion 22 in parallel with each other. The pair of rod-shaped extension portions 31 and 31 are made of a material having a satisfactory thermal conductivity, for example, copper.

A ring-shaped spacer 61 is connected to the upper ends of the pair of rod-shaped extension portions 31 and 31. The spacer 61 is formed in a ring shape having an axis along the up-down direction. The spacer 61 is made of a material having a satisfactory thermal conductivity, for example, copper. The superconductor 40 is arranged on the upper surface of the ring-shaped spacer 61. Therefore, the pair of rod-shaped extension portions 31 and 31 extend from the stage portion 22 to be brought into thermal contact with the superconductor 40 through the spacer 61 at their extended ends.

The superconductor 40 is a superconducting bulk made of a type-II superconductor, and is manufactured by a known melt-textured growth process. Examples of the type-II superconductor may include a RE-Ba—Cu—O (where RE represents a rare-earth element including Y) type superconductor, which is a high-temperature oxide superconductor. The superconductor 40 in the first embodiment is also formed in a cylindrical shape. In this case, the superconductor 40 is formed so that its c-axis direction matches the axial direction of the cylinder. In the first embodiment, the superconductor 40 is formed by stacking a plurality of (in FIG. 3 and FIG. 4, four) cylindrical-shaped superconducting bulks along the axial direction. The superconductor 40 may be formed of one superconducting bulk.

In addition, a holder 62 is arranged on the superconductor 40 so as to cover the outer peripheral surface and the upper end surface of the superconductor 40. The holder 62 includes a cylindrical part 62a, which covers the outer peripheral surface of the superconductor 40, and a ring-shaped lid part 62b, which extends from the upper end of the cylindrical part 62a to the radially inner side of the superconductor 40 to cover the upper end surface of the superconductor 40. The superconductor 40 is held by the holder 62.

The vacuum heat insulating container 50 is arranged in the upper part of the refrigerating machine 10 so as to cover the cold head 20, the rod-shaped extension portions 31, and the superconductor 40. The contour shape of the vacuum heat insulating container 50 is a cylindrical shape having an axis in the up-down direction in FIG. 1 to FIG. 4. The vacuum heat insulating container 50 has an internal space, and is made of such a material that can thermally insulate the internal space from the outside. The cold head 20, the rod-shaped extension portions 31, and the superconductor 40 are received in the internal space of the vacuum heat insulating container 50 thermally insulated from the outside.

As illustrated in FIG. 3 and FIG. 4, the vacuum heat insulating container 50 includes a first container portion 51, a second container portion 52, and a third container portion 53, and those container portions are provided in the stated order from the top.

The third container portion 53 is formed in a cylindrical shape, and has its lower end hermetically connected to the upper surface of the refrigerating machine 10, and extends upward from the upper surface of the refrigerating machine 10. The cold head 20 provided on the upper part of the refrigerating machine 10 is arranged in a third internal space S3 being the internal space of the third container portion 53.

Figure 5:
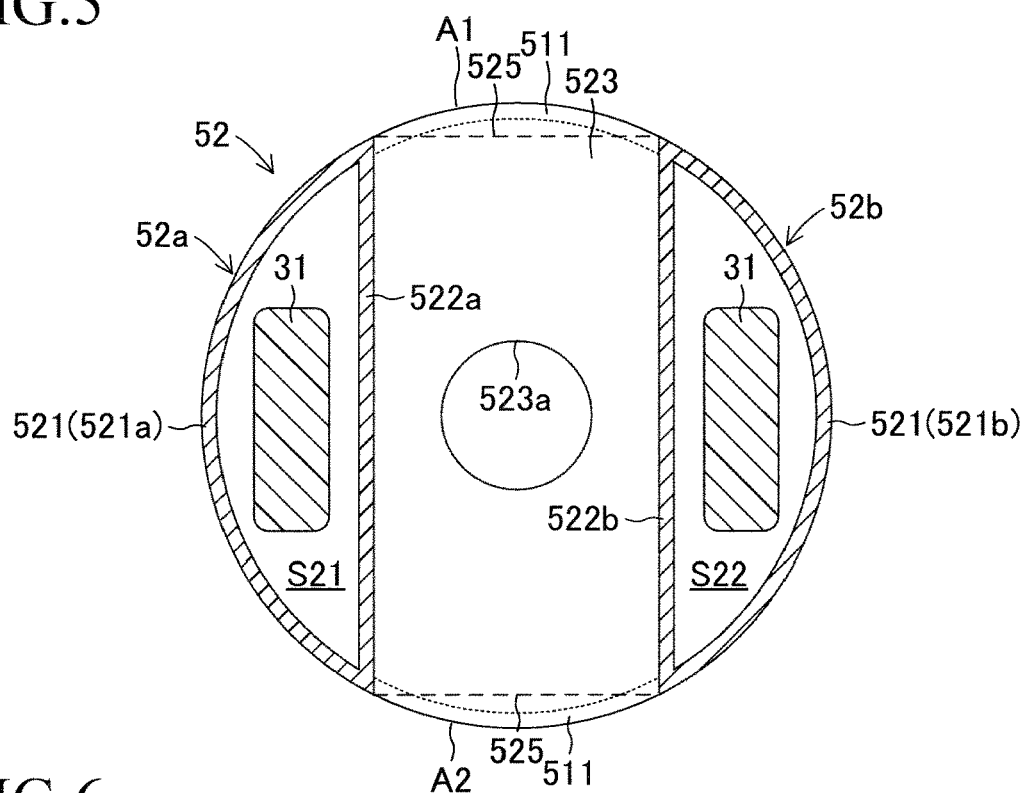
FIG. 5 is a cross-sectional view taken along the line V-V of FIG. 3.

The second container portion 52 is provided on the upper part of the third container portion 53. FIG. 5 is a cross-sectional view taken along the line V-V of FIG. 3. FIG. 5 is an illustration of a cross-sectional shape of the second container portion 52. As illustrated in FIG. 5, the second container portion 52 includes an outer peripheral wall portion 521, a pair of inner side wall portions 522a and 522b, and an upper wall portion 523. As illustrated in FIG. 3 and FIG. 4, the second container portion 52 has a bottom wall portion 524 formed below the upper wall portion 523 so as to face the upper wall portion 523.

The outer peripheral wall portion 521 exhibits a cylindrical shape, and has its lower end hermetically connected to the upper end of the third container portion 53 as illustrated in FIG. 3 and FIG. 4. A pair of openings 525 and 525 are formed in the outer peripheral wall portion 521. As illustrated in FIG. 5, the pair of openings 525 and 525 are formed at two positions shifted by 180° in the circumferential direction of the outer peripheral wall portion 521. Therefore, the pair of openings 525 and 525 are provided so as to face each other along the radial direction of the outer peripheral wall portion 521. The pair of openings 525 and 525 have the same shape, and in the first embodiment, the shape is a rectangular shape as illustrated in FIG. 2.

In addition, as illustrated in FIG. 5, the outer peripheral wall portion 521 is divided into two arc portions 521a and 521b each having an arc-shaped cross section by the pair of openings 525 and 525. Both ends of one arc portion 521a in the circumferential direction are connected to each other by one inner side wall portion 522a, and both ends of the other arc portion 521b in the circumferential direction are connected to each other by the other inner side wall portion 522b. Therefore, one arc portion 521a and one inner side wall portion 522a form a first housing portion 52a including a first housing space S21 having a semicircular cross section, and the other arc portion 521b and the other inner side wall portion 522b form a second housing portion 52b including a second housing space S22 having a semicircular cross section. The first housing portion 52a and the second housing portion 52b are formed so as to have their inner side wall portions 522 facing each other. The first housing space S21 and the second housing space S22 correspond to a second internal space S2 in at least one embodiment.

As illustrated in FIG. 3, the lower end portion of the first housing space S21 and the lower end portion of the second housing space S22 communicate to the third internal space S3. One of the rod-shaped extension portions 31, which are erected upward from the upper surface of the stage portion 22 of the cold head 20 arranged in the third internal space S3, is arranged in the first housing space S21, and the other one of the rod-shaped extension portions 31 is arranged in the second housing space S22.

In addition, the upper side of the inner side wall portion 522a of the first housing portion 52a and the upper side of the inner side wall portion 522b of the second housing portion 52b are connected to each other by the upper wall portion 523, and the lower side of the inner side wall portion 522a of the first housing portion 52a and the lower side of the inner side wall portion 522b of the second housing portion 52b are connected to each other by the bottom wall portion 524. As illustrated in FIG. 5, the upper wall portion 523 is provided in a region defined by the upper sides of the pair of inner side wall portions 522a and 522b and the arc portions (part A1 and part A2 in FIG. 5) of the outer peripheral wall portion 521 cut out when the openings 525 are formed. Therefore, the upper wall portion 523 is formed in a shape obtained by cutting out parts of a circular shape. A circular hole 523a is formed at the center of the upper wall portion 523. Meanwhile, the bottom wall portion 524 is provided in a region defined by the lower sides of the pair of inner side wall portions 522a and 522b and the arc portions of the outer peripheral wall portion 521 cut out when the openings 525 are formed. Therefore, in the same manner as in the case of the upper wall portion 523, the bottom wall portion 524 is formed in a shape obtained by cutting out parts of a circular shape. As illustrated in FIG. 4, the bottom wall portion 524 is hermetically connected to the upper end of the third container portion 53 at the peripheral edge of the arc portions in which the openings 525 are formed.

The pair of inner side wall portions 522a and 522b, the upper wall portion 523, and the bottom wall portion 524 form a space having both ends opened at the openings 525 and 525. This space is defined as a communication space CS. In this manner, the communication space CS is formed in the second container portion 52. As illustrated in FIG. 3, the communication space CS is formed by a space between the first housing portion 52a and the second housing portion 52b of the second container portion 52, and penetrates through the second container portion 52 from one opening 525 to the other opening 525 in the radial direction. As is clear from FIG. 3 and FIG. 4, the radial direction of the second container portion 52 is a direction perpendicular to the axial direction of the cylindrical-shaped superconductor 40. Therefore, the communication space CS is formed so as to penetrate the second container portion 52 along a direction perpendicular to the axial direction of the superconductor 40.

The first container portion 51 is provided on the upper part of the second container portion 52. The first container portion 51 includes an outer peripheral wall portion 511, an inner peripheral wall portion 512, and an upper wall portion 513. The outer peripheral wall portion 511 is formed in a cylindrical shape, and has its lower end hermetically connected to the upper end of the outer peripheral wall portion 521 of the second container portion 52. As illustrated in FIG. 4, the lower end of a part corresponding to the part in which the openings 525 are formed at the lower end of the outer peripheral wall portion 511 of the first container portion 51 is hermetically connected to the upper wall portion 523 of the second container portion 52.

The upper wall portion 513 extends from the upper end of the outer peripheral wall portion 511 of the first container portion 51 to the radially inner side of the outer peripheral wall portion 511. The upper wall portion 513 has a disc shape, and a circular hole 513a is formed at its center. The circular hole 513a is formed so as to be arranged coaxially with the circular hole 523a formed in the upper wall portion 523 of the second container portion 52. The inner peripheral wall portion 512 extends downward from the peripheral edge of the circular hole 513a of the upper wall portion 513. The lower end of the inner peripheral wall portion 512 is hermetically connected to the peripheral edge portion of the circular hole 523a formed in the upper wall portion 523 of the second container portion 52.

A first internal space S1 is formed between the outer peripheral wall portion 511 and the inner peripheral wall portion 512 of the first container portion 51. As illustrated in FIG. 3, the lower end of the first internal space S1 communicates to the first housing space S21 and the second housing space S22 formed in the second container portion 52. The first internal space S1 is a ring-shaped space, and the spacer 61 and the superconductor 40 are arranged in the first internal space S1. In addition, the upper end of the first internal space S1 is closed by the upper wall portion 513 of the first container portion 51. When the superconductor 40 is arranged in the first internal space S1, the outer peripheral wall portion 511 of the first container portion 51 faces the outer peripheral surface of the superconductor 40, and the inner peripheral wall portion 512 of the first container portion 51 faces the inner peripheral surface of the superconductor 40.

In this manner, the first internal space S1 of the first container portion 51 and the second internal space S2 (first housing space S21 and second housing space S22) of the second container portion 52 communicate to each other, and the second internal space S2 (first housing space S21 and second housing space S22) of the second container portion 52 and the third internal space S3 of the third container portion 53 communicate to each other. Those spaces communicating to each other form the internal space of the vacuum heat insulating container 50. In the internal space of the vacuum heat insulating container 50, the superconductor 40 is arranged in the first internal space S1 formed in the first container portion 51, the rod-shaped extension portions 31 (cold head extension portion) are arranged in the second internal space S2 (first housing space S21 and second housing space S22) formed in the second container portion 52, and the cold head 20 is arranged in the third internal space S3 formed in the third container portion 53.

In addition, a room temperature bore space BS is formed by a columnar space on the inner peripheral side of the inner peripheral wall portion 512 of the first container portion 51. The room temperature bore space BS is a space formed on the inner peripheral side of the superconductor 40 arranged in the first internal space S1 of the first container portion 51. The room temperature bore space BS is also formed so as to penetrate the first container portion 51 in the up-down direction. The upper end of the room temperature bore space BS communicates (is opened) to the outside through the circular hole 513a formed in the upper wall portion 513 of the first container portion 51. Meanwhile, the lower end of the room temperature bore space BS communicates to the communication space CS through the circular hole 523a formed in the upper wall portion 523 of the second container portion 52. The room temperature bore space BS and the communication space CS are spaces that are thermally and spatially isolated (partitioned) from the internal space of the vacuum heat insulating container 50.

Figure 6:
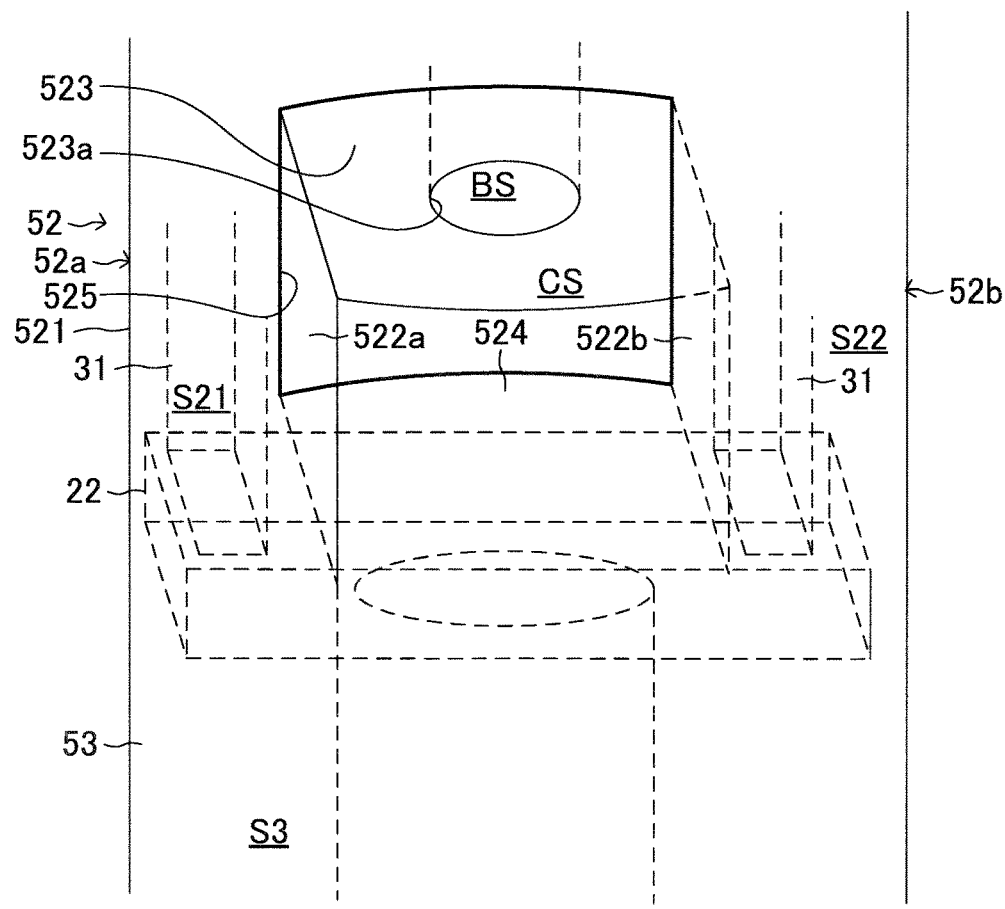
FIG. 6 is a perspective view for schematically illustrating the structure near a communication space.

FIG. 6 is a perspective view for schematically illustrating the structure near the communication space CS. As illustrated in FIG. 6, the openings 525 are formed in the outer peripheral wall portion 521 of the second container portion 52 of the vacuum heat insulating container 50, to thereby form the communication space CS extending from the openings 525 in the radial direction of the second container portion 52. The communication space CS is formed by a space surrounded by the pair of inner side wall portions 522a and 522b, the upper wall portion 523, and the bottom wall portion 524 of the second container portion 52. In addition, the circular hole 523a is formed in the upper wall portion 523 of the second container portion 52, and the communication space CS communicates to the room temperature bore space BS through the circular hole 523a. Meanwhile, the stage portion 22 of the cold head 20 received in the third internal space S3 of the third container portion 53 is arranged below the communication space CS across the bottom wall portion 524 of the second container portion 52. The rod-shaped extension portions 31 are provided so as to extend upward from both side end portions of the stage portion 22. The rod-shaped extension portions 31 are arranged in the first housing space S21 in the first housing portion 52a and the second housing space S22 in the second housing portion 52b provided on both sides of the communication space CS.

The magnetic field generator 100 having the above-mentioned configuration is incorporated into a nuclear magnetic resonance apparatus. In this case, a sample tube containing a measurement sample is set in the room temperature bore space BS of the magnetic field generator 100. The magnetic field generator 100 is also mounted with a room temperature shim coil 87 configured to adjust a magnetic field (capture magnetic field) of the superconductor 40, and a probe unit 81 configured to detect an NMR signal obtained from the measurement sample.

Figure 7:
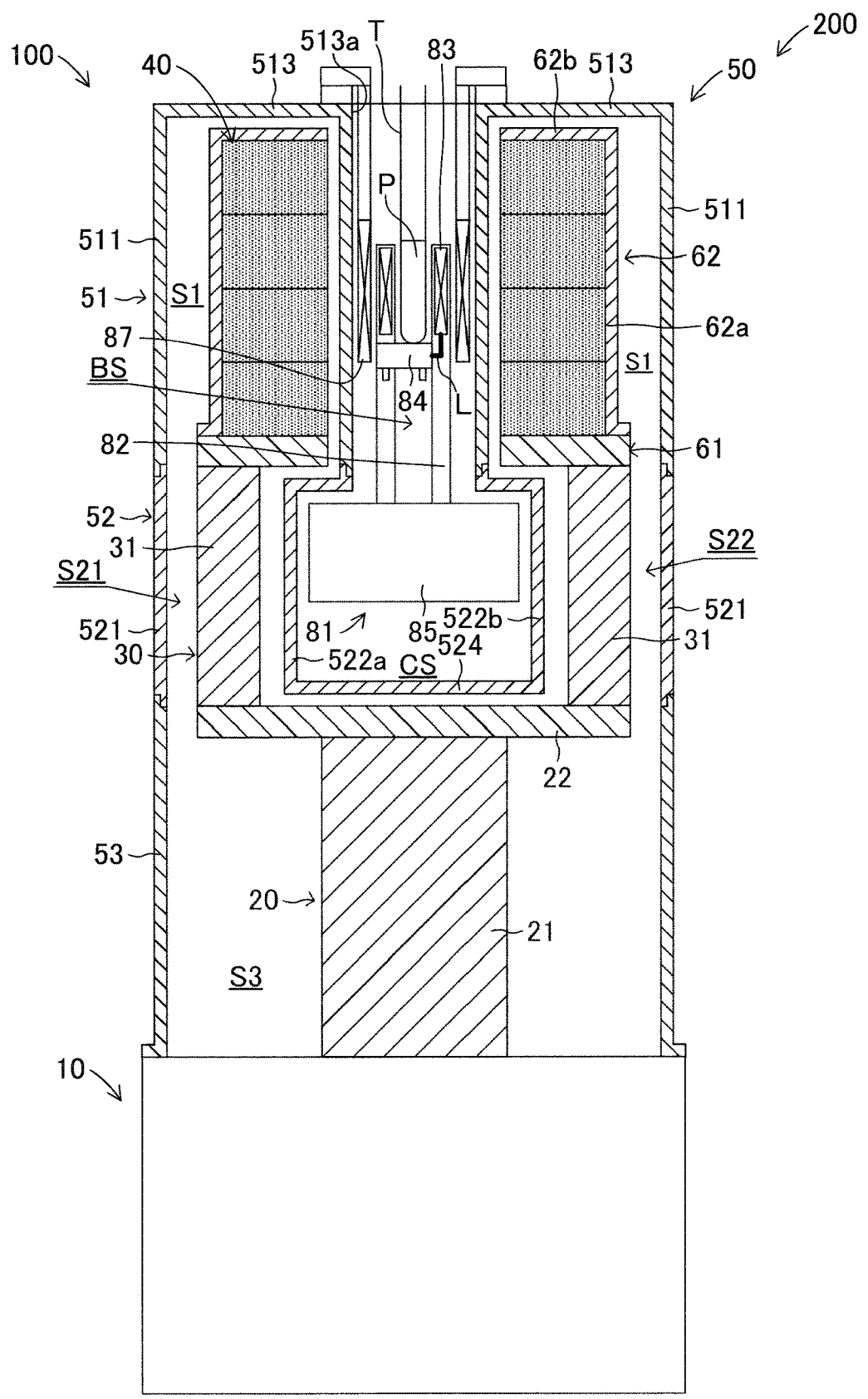
FIG. 7 is a schematic view of a nuclear magnetic resonance apparatus into which the magnetic field generator according to the first embodiment is incorporated.
Figure 8:
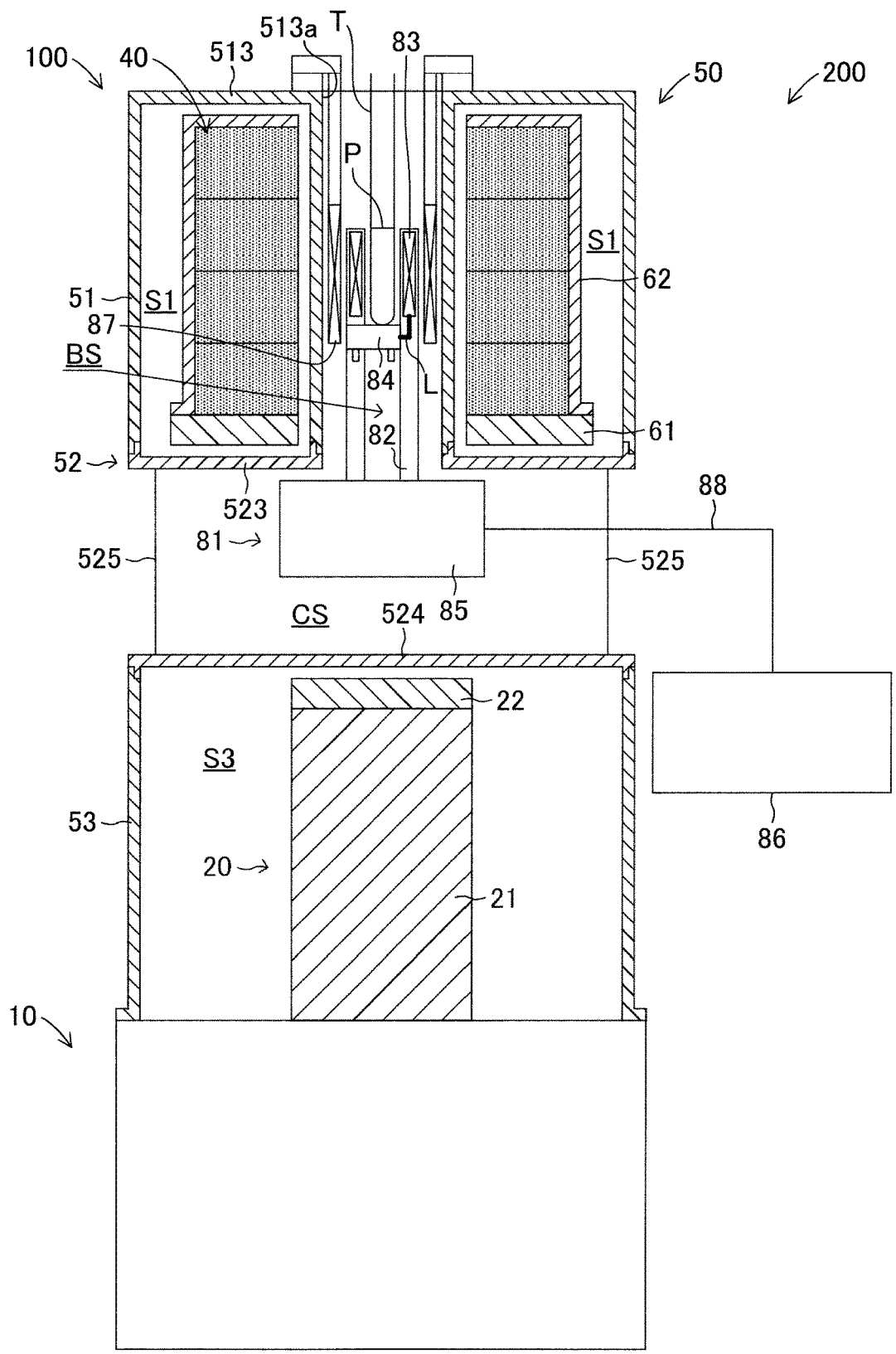
FIG. 8 is a schematic view of the nuclear magnetic resonance apparatus into which the magnetic field generator according to the first embodiment is incorporated.

FIG. 7 and FIG. 8 are schematic views of a nuclear magnetic resonance apparatus 200 into which the magnetic field generator 100 is incorporated. FIG. 7 is an illustration of a cross section of the magnetic field generator 100 viewed from a direction from which FIG. 3 is illustrated, and FIG.

8 is an illustration of a cross section of the magnetic field generator 100 viewed from a direction from which FIG. 4 is illustrated.

As illustrated in FIG. 7, the nuclear magnetic resonance apparatus 200 includes the magnetic field generator 100, the probe unit 81, and an analysis device 86. In FIG. 7, the analysis device 86 is omitted. The probe unit 81 includes a cylindrical-shaped probe main body 82 with a detection coil 83 mounted to its tip, a tuning circuit 84, and a probe base portion 85. A sample tube T containing a measurement sample P to be measured by the nuclear magnetic resonance apparatus 200 is inserted into the room temperature bore space BS through the circular hole 513a forming the upper end of the room temperature bore space BS. The sample tube T is arranged inside the probe main body 82 so as to be inserted into the room temperature bore space BS up to a position at which the detection coil 83 of the probe main body 82 is arranged. The sample tube T arranged in the probe main body 82 is rotated about its axis in a floating state by a holding device (not shown). In this manner, the sample tube T is set in the room temperature bore space BS.

The detection coil 83 detects a signal obtained from the measurement sample P as an NMR signal. Around the outer periphery of the sample tube T in the room temperature bore space BS, the detection coil 83 is arranged particularly around the outer periphery of the lower portion of the sample tube T in which the measurement sample P is located. The room temperature shim coil 87 is arranged around the outer periphery of the detection coil 83. The room temperature shim coil 87 is arranged at the position illustrated in FIG. 7 by being inserted into the room temperature bore space BS through the upper end opening (circular hole 513a) of the room temperature bore space BS in the same manner as in the case of the sample tube T.

Figure 18:
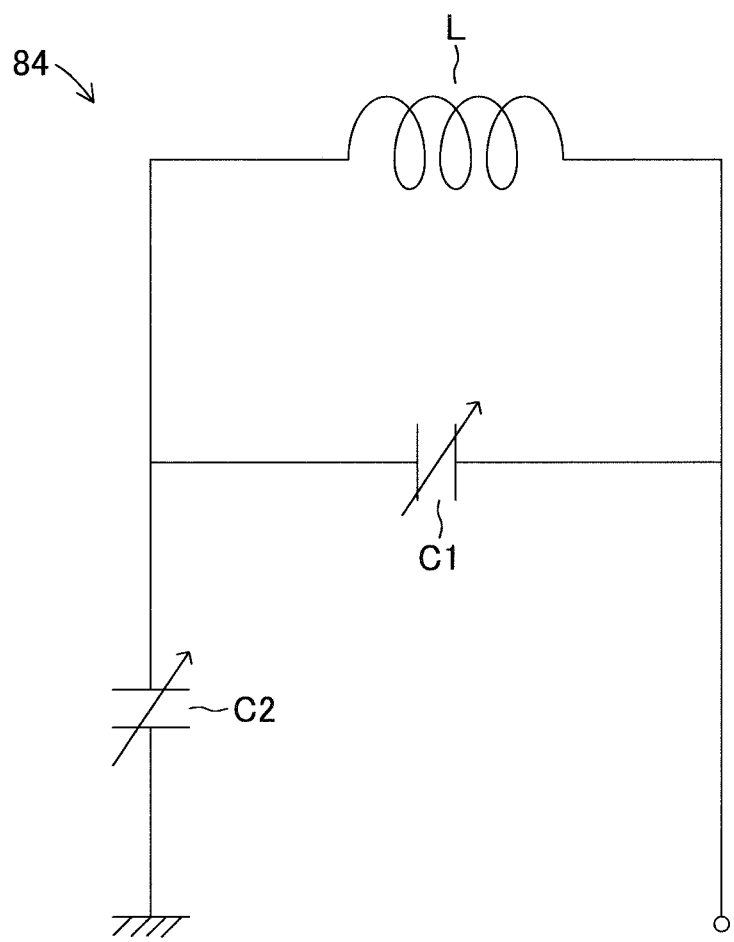
FIG. 18 is a diagram for illustrating an electrical configuration of a tuning circuit.

The tuning circuit 84 is configured to be able to obtain a resonance signal of the NMR signal obtained from the measurement sample P. As illustrated in FIG. 18, the tuning circuit 84 includes a parallel resonance circuit that is electrically connected to the detection coil 83. The capacitances of a variable capacitor C1 (variable capacitor for tuning) and a variable capacitor C2 (variable capacitor for matching) in the parallel resonance circuit are adjusted, to thereby perform tuning (tuning of a resonance frequency to the frequency of a nucleus to be measured) and matching (matching of the impedance of the parallel resonance circuit to the characteristic impedance). The tuning circuit 84 is mounted to the probe main body 82, and is arranged directly below the sample tube T in the room temperature bore space BS as illustrated in FIG. 7. The tuning circuit 84 is also electrically connected to the detection coil 83 through a transmission line L. In this case, the detection coil 83 is arranged around the outer periphery of the lower portion of the sample tube T containing the measurement sample P, and hence the tuning circuit 84 located directly below the sample tube T is arranged closely to the detection coil 83. Therefore, the length of the transmission line L connecting the tuning circuit 84 and the detection coil 83 to each other can be made as short as possible.

The tuning circuit 84 is provided with a knob for tuning and a knob for matching. The tuning and the matching are executed by rotating those operation knobs, to thereby adjust the sensitivity of the NMR signal obtained from the measurement sample P.

In addition, the probe main body 82 extends downward from its tip position at which the detection coil 83 is mounted through the room temperature bore space BS, and is connected at its lower end to the probe base portion 85 arranged in the communication space CS. In the probe base portion 85, a connector portion for electrically connecting the detection coil 83 and the analysis device 86 to each other is arranged.

As illustrated in FIG. 8, the probe base portion 85 is connected to the analysis device 86 through a cable 88. The cable 88 is connected to the probe base portion 85 at one end, and is led to the outside through the opening 525 of the communication space CS, to be connected to the analysis device 86 arranged outside the magnetic field generator 100 at the other end.

Figure 9:
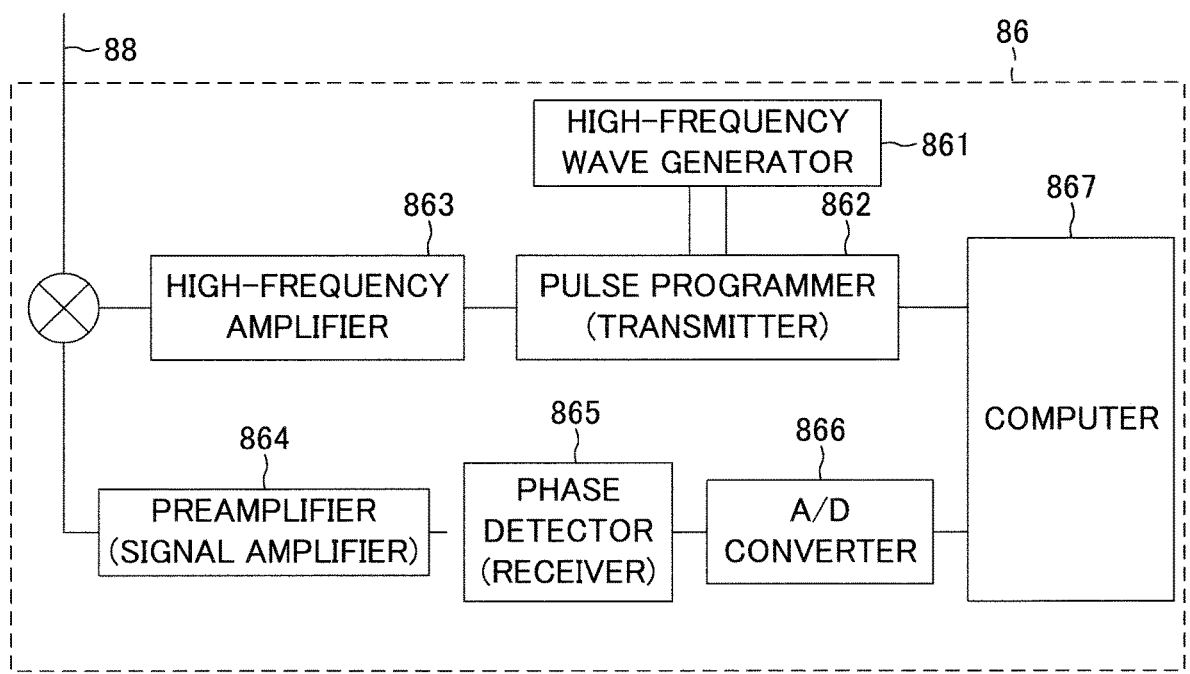
FIG. 9 is a diagram for schematically illustrating a configuration of an analysis device.

FIG. 9 is a diagram for schematically illustrating the configuration of the analysis device 86. As illustrated in FIG. 9, the analysis device 86 includes a high-frequency wave generator 861, a pulse programmer (transmitter) 862, a high-frequency amplifier 863, a preamplifier (signal amplifier) 864, a phase detector 865, an analog-digital (A/D) converter 866, and a computer 867.

The nuclear magnetic resonance apparatus 200 configured as described above is operated in accordance with the following procedure. First, the superconductor 40 of the magnetic field generator 100 is magnetized. The procedure for magnetization is as follows. First, the internal space of the vacuum heat insulating container 50 is brought into a vacuum state of, for example, $1\times10^{-3}$ Pa or lower. Subsequently, an external magnetic field generator is used to apply a highly uniform external magnetic field to the superconductor 40. After that, the refrigerating machine 10 is activated. When the refrigerating machine 10 is activated, the cooling energy is transmitted to the superconductor 40 through the cold head 20 and the rod-shaped extension portions 31 (cold head extension portion). The superconductor 40 is thus cooled.

The superconductor 40 is cooled to a temperature equal to or lower than a superconducting transition temperature. When the cooling of the superconductor 40 is completed, the external magnetic field applied to the superconductor 40 is eliminated (that is, the external magnetic field is set to 0). With this operation, the superconductor 40 captures an external magnetic field to be magnetized. Even after the external magnetic field is eliminated by the magnetic field based on which the superconductor 40 has been magnetized, a highly uniform magnetic field similar to the external magnetic field is formed around the superconductor 40. As a result, a highly uniform magnetic field is formed in the room temperature bore space BS. Therefore, the measurement sample P in the sample tube T arranged in the room temperature bore space BS is placed in a static magnetic field space.

After the superconductor 40 is magnetized, the probe unit 81 is installed in the nuclear magnetic resonance apparatus 200 as illustrated in FIG. 7, and the probe main body 82 mounted with the detection coil 83 and the tuning circuit 84 is inserted into the room temperature bore space BS.

The nuclear magnetic resonance apparatus 200 in which the installation of the probe unit 81 has been completed is used to perform measurement. The measurement is performed in accordance with the following procedure under a state in which the probe unit 81 has been installed. The measurement sample P (sample tube T) is inserted into the room temperature bore space BS (into the probe main body 82). With this insertion, the measurement sample P is placed in the static magnetic field space inside the room temperature bore space BS. After that, the high-frequency wave generator 861 of the analysis device 86 is activated. Then, a high-frequency pulse generated by the high-frequency wave generator 861 passes through the pulse programmer 862 and the high-frequency amplifier 863 to energize the detection coil 83, and the measurement sample P is irradiated with a pulsed electromagnetic wave (radio wave). A micro-current flows through the detection coil 83 provided around the measurement sample P by nuclear magnetic resonance generated when the measurement sample P placed in a static magnetic field is irradiated with a radio wave. A signal (NMR signal) representing this micro-current is passed to the computer 867 through the preamplifier 864, the phase detector 865, and the A/D converter 866. The computer 867 calculates an NMR spectrum based on the passed NMR signal. The molecular structure of the measurement sample P is analyzed from the obtained NMR spectrum.

In the first embodiment, the room temperature bore space BS, which is opened at its upper end and communicates to the outside, is formed so as to penetrate the first container portion 51 in the up-down direction, and the lower end of the room temperature bore space BS communicates to the communication space CS, which is formed so as to penetrate the second container portion 52 in the radial direction (direction perpendicular to the axial direction of the superconductor 40). The communication space CS is opened to the outside through the opening 525. Therefore, the probe main body 82 having the detection coil 83 and the tuning circuit 84 are inserted into the room temperature bore space BS from its lower end through the communication space CS, while the detection coil 83 is arranged around the outer periphery of the sample tube T, and the tuning circuit 84 is arranged directly below the sample tube T.

As is clear from FIG. 3 and FIG. 7, the cross-sectional area (horizontal cross-sectional area) of the communication space CS cut along a horizontal plane (plane perpendicular to the axial direction of the superconductor 40) is larger than the horizontal cross-sectional area of the room temperature bore space BS. This allows a worker to work by putting a hand into the communication space CS, and improves the installation workability of the probe main body 82 and the tuning circuit 84 in the room temperature bore space BS. In this case, by mounting the tuning circuit 84 to the probe main body 82 at a desired position, those components can be integrally arranged in the room temperature bore space BS. This further improves the installation workability of those components.

When the probe unit 81 is first installed, it is required to perform the work for adjusting the sensitivity of the NMR signal obtained from the measurement sample by operating the tuning circuit 84 after arranging the tuning circuit 84 at a desired position in the room temperature bore space BS. The adjustment of the sensitivity is performed by inserting a sample tube containing a standard sample for the adjustment of the sensitivity into the probe main body 82, and rotating the knob for tuning and the knob for matching, which are provided to the tuning circuit 84, so that the NMR signal obtained from the standard sample has a predetermined sensitivity. In this case, it suffices that, for example, the tuning circuit 84 is arranged in the room temperature bore space BS under a state in which a guide wire (operation means) capable of transmitting a rotational torque at its one end to the other end has the other end mounted to each of the operation knobs (tuning knob and matching knob) of the tuning circuit 84, and the one end of the guide wire is led to the outside through the room temperature bore space BS and the communication space CS. In this case, as illustrated in FIG. 8, the detection coil 83 and the sample tube T are absent in a region near the lower end of the room temperature bore space BS (specifically, region below the arrangement position of the sample tube T), and a relatively large space is secured. This allows the guide wire connected to each of the operation knobs of the tuning circuit 84 to be led to the outside through the region at the lower end of the room temperature bore space BS and the communication space CS. With this capability, the rotation operation on the one end side of the guide wire can be transmitted to each of the operation knobs. Therefore, the sensitivity of the NMR signal can be adjusted by an external operation through use of the tuning circuit 84.

Figure 19:
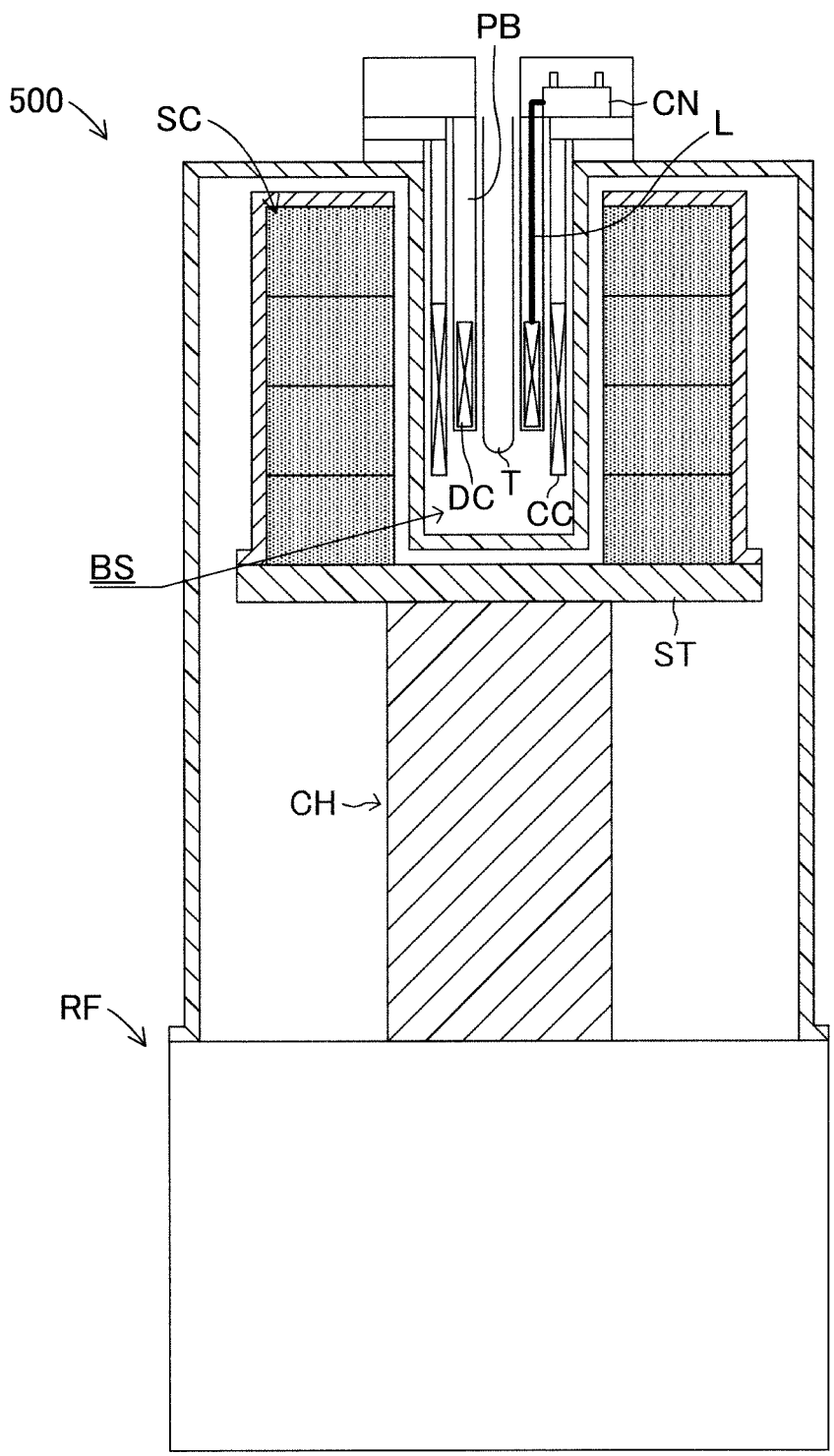
FIG. 19 is a schematic view of a configuration of a nuclear magnetic resonance apparatus into which a related-art magnetic field generator is incorporated.

FIG. 19 is a schematic view of a configuration of a nuclear magnetic resonance apparatus into which a related-art magnetic field generator is incorporated. In FIG. 19, the analysis device of the nuclear magnetic resonance apparatus is omitted. As illustrated in FIG. 19, a cylindrical-shaped superconductor SC provided to a related-art magnetic field generator 500 is directly placed on a stage portion ST of a cold head CH extending upward from the upper part of a refrigerating machine RE. The stage portion ST is arranged so as to cover the lower region of the superconductor SC and the room temperature bore space BS. Therefore, the upper end of the room temperature bore space BS is opened, but the lower end is closed. This causes the room temperature bore space BS to be accessed from its upper end at all times. Therefore, the sample tube T, a room temperature shim coil CC, and a detection unit (probe unit) for an NMR signal are all inserted into the room temperature bore space BS from the upper end. In this case, after the sample tube T is inserted into the room temperature bore space BS, the room temperature shim coil CC and a detection coil DC of the detection unit can be inserted into the room temperature bore space BS from the upper end of the room temperature bore space BS. However, a tuning circuit CN included in the detection unit cannot be inserted into the room temperature bore space BS due to interference with the sample tube T even when an attempt is made to insert the tuning circuit CN into the room temperature bore space BS from its upper end. Alternatively, when the sample tube T is inserted after the detection unit is inserted into the room temperature bore space BS, the detection unit can be inserted into the room temperature bore space BS without interfering with the sample tube T. However, in this case, it is impossible to secure, in the room temperature bore space BS, a space for leading a guide wire or other such operation means, which is configured to operate the tuning circuit CN inserted into the room temperature bore space BS, from the upper end of the room temperature bore space BS. This inhibits the tuning circuit CN from being externally operated, and inhibits the sensitivity of the NMR signal from being adjusted. Therefore, hitherto, the tuning circuit CN is placed in the upper part of the magnetic field generator 500 as illustrated in FIG. 19. In this case, there is no other way than to increase the length of the transmission line L connecting the tuning circuit CN and the detection coil DC to each other.

In contrast, in the magnetic field generator 100 according to the first embodiment, as described above, the room temperature bore space BS is formed so as to penetrate the first container portion 51 in the up-down direction, and the room temperature bore space BS has the upper end opened to the outside and the lower end communicating to the communication space CS opened to the outside. In short, both ends of the room temperature bore space BS communicate to the outside. This allows the room temperature bore space BS to be accessed from the lower end of the room temperature bore space BS, and a required instrument can be inserted into the room temperature bore space BS not only from the upper end side but also from the lower end side. Therefore, when inserting the tuning circuit 84 into the room temperature bore space BS, in order to avoid interfering with the sample tube T, it is possible to insert the tuning circuit 84 into the room temperature bore space BS from the lower end opposite to the upper end from which the sample tube T is inserted. In this case, the tuning circuit 84 is inserted from the lower end into the room temperature bore space BS through the communication space CS. In addition, by inserting the tuning circuit 84 from the lower end side of the room temperature bore space BS, it is possible to arrange the tuning circuit 84 in a region between the lower end being an end portion opposite to the upper end from which the sample tube T is inserted into the room temperature bore space BS and a position at which the sample tube T is arranged. Specifically, the tuning circuit 84 can be arranged directly below the sample tube T in the room temperature bore space BS. This can reduce the length of the transmission line L connecting the tuning circuit 84 and the detection coil 83 to each other as much as possible. Then, as described above, a guide wire or other such operation means, which is connected to the tuning circuit 84 in order to operate the tuning circuit 84, is led to the outside from the region at the lower end of the room temperature bore space BS having sufficient room through the communication space CS, to thereby allow the sensitivity of the NMR signal to be adjusted by externally operating the tuning circuit 84 in the room temperature bore space BS through the operation means.

Figure 10:
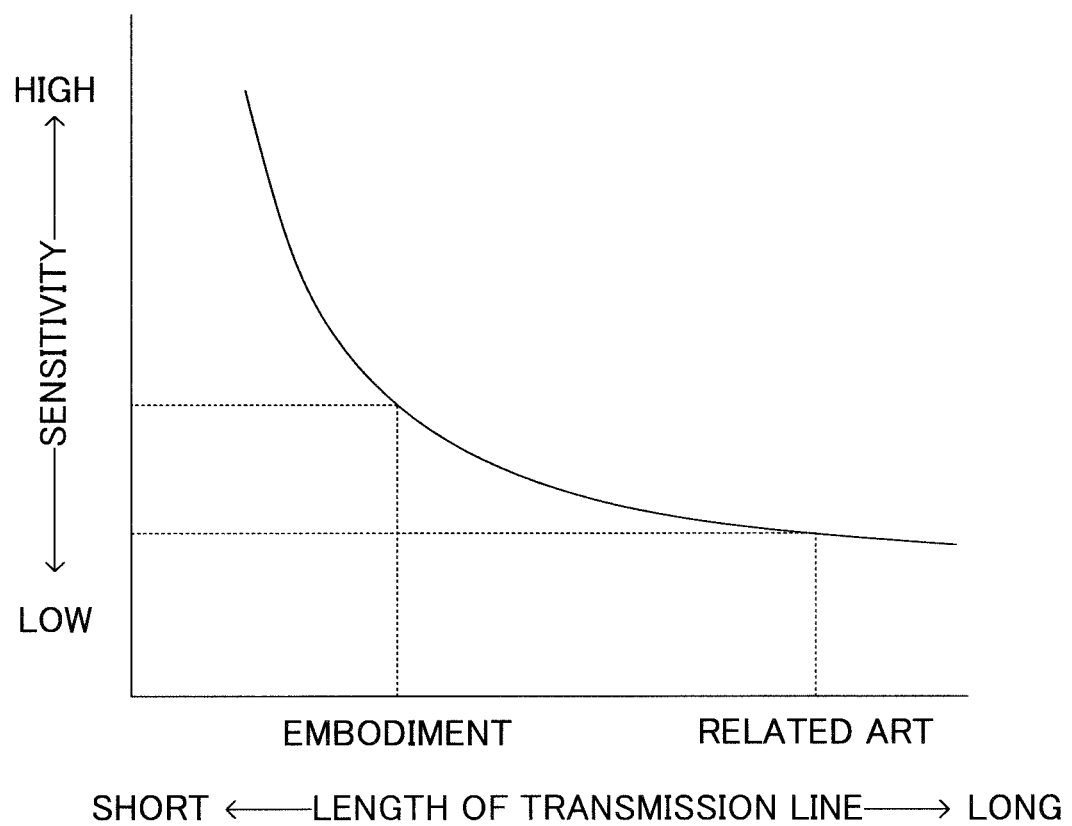
FIG. 10 is a graph for showing a relationship between the length of a transmission line and the sensitivity of an NMR signal.

FIG. 10 is a graph for showing a relationship between the length of the transmission line L and the sensitivity of the NMR signal. In FIG. 10, the horizontal axis represents the length of the transmission line L, and the vertical axis represents the sensitivity. As is clear from FIG. 10, as the length of the transmission line L becomes shorter, the sensitivity becomes higher. Therefore, by configuring the magnetic field generator as in the first embodiment, it is possible to prevent a decrease in sensitivity of the NMR signal ascribable to an increase in distance between the detection coil 83 and the tuning circuit 84.

According to the first embodiment, both ends of the room temperature bore space BS formed on the inner peripheral side of the cylindrical-shaped superconductor 40 communicate to the outside. This allows the room temperature bore space BS to be accessed from any one of both ends. Therefore, for example, a sample tube containing a measurement sample can be inserted into the room temperature bore space BS from one end side of the room temperature bore space BS, and a detection coil 83 and a tuning circuit 84 of a detection unit can be inserted into the room temperature bore space BS from the other end side of the room temperature bore space BS. At this time, the tuning circuit 84 is inserted into the room temperature bore space BS from an end portion opposite to an end portion from which the sample tube has been inserted, and hence the tuning circuit 84 can be inserted into the room temperature bore space BS without interfering with the sample tube, and can be arranged at a desired position. When the detection coil 83 and the tuning circuit 84 are thus arranged in the room temperature bore space BS, a distance between the detection coil 83 and the tuning circuit 84 is shortened as compared to a related art. Therefore, it is possible to suppress the deterioration in sensitivity of the NMR signal ascribable to the long distance between the detection coil 83 and the tuning circuit 84. In addition, a space in which the detection coil 83 and the sample tube are not arranged is present in an end portion region (opposite end portion region) opposite to, out of both end portions of the room temperature bore space BS, an end portion from which the sample tube has been inserted. This allows the guide wire or other such operation means, which is connected to the tuning circuit 84 in the room temperature bore space BS, to be led to the outside through the opposite end portion region. Therefore, the sensitivity of the NMR signal can be adjusted by externally operating the tuning circuit 84 in the room temperature bore space BS.

In this case, according to the first embodiment, the vacuum heat insulating container 50 includes a first container portion 51 having formed therein a first internal space S1 in which the superconductor 40 is arranged, a second container portion 52 having formed therein a second internal space S2 in which the cold head extension portion is arranged, the second internal space S2 communicating to the first internal space S1, and a third container portion 53 having formed therein a third internal space S3 in which the cold head 20 is arranged, the third internal space S3 communicating to the second internal space S2. Further, according to the first embodiment, the first container portion 51 includes an outer peripheral wall portion 511 which faces an outer peripheral surface of the superconductor 40, and an inner peripheral wall portion 512 which faces an inner peripheral surface of the superconductor 40. Then the first internal space S1 is formed by a space surrounded by the outer peripheral wall portion 511 and the inner peripheral wall portion 512, and the room temperature bore space BS is formed by a space on an inner peripheral side of the inner peripheral wall portion 512. Further, according the first embodiment, the room temperature bore space BS is formed so as to be opened to the outside at its one end, to extend in the axial direction of the superconductor 40, and to penetrate the first container portion 51. Further, according to the first embodiment, the second container portion 52 has formed therein a communication space CS which is opened to the outside, and communicate to another end of the room temperature bore space BS.

According to the above-mentioned configuration, the cold head extension portion is interposed between the superconductor 40 and the cold head 20, and the communication space CS opened to the outside and communicating to the other end of the room temperature bore space BS is formed in the second container portion 52 of the vacuum heat insulating container 50 in which the cold head extension portion is received. With this configuration, one end of the room temperature bore space BS is opened to the outside, and the other end of the room temperature bore space BS is opened to the outside through the communication space CS. Therefore, the detection coil 83 and the tuning circuit 84 of the detection unit can be inserted into the room temperature bore space BS from the other end side of the room temperature bore space BS through the communication space CS opened to the outside. In addition, the operation means connected to the tuning circuit 84 in the room temperature bore space BS can be led to the outside from the region on the other end side of the room temperature bore space BS through the communication space CS. Then, the sensitivity of the NMR signal can be adjusted by operating the tuning circuit 84 in the room temperature bore space BS by the led operation means.

Further, in this case, according to the first embodiment, the communication space CS is formed so that a cross-sectional area of the communication space CS perpendicular to the axial direction of the superconductor 40 is larger than a cross-sectional area of the room temperature bore space BS perpendicular to the axial direction of the superconductor 40. According to this configuration, the cross-sectional area of the communication space CS is large, and hence it is easy to perform the work for inserting the detection coil 83 and the tuning circuit 84 into the room temperature bore space BS through the communication space CS. That is, it is possible to improve the workability of the work for inserting the detection coil 83 and the tuning circuit 84 into the room temperature bore space BS.

According to the first embodiment, the cold head extension portion include a pair of rod-shaped extension portions (31, 31), which extend from the cold head 20 in parallel with each other. In this case, according to the first embodiment, the second container portion 52 includes a first housing portion 52a having formed therein a first housing space S21 in which one of the pair of rod-shaped extension portions 31 is received, and a second housing portion 52b having formed therein a second housing space S22 in which another one of the pair of rod-shaped extension portions 31 is received. The second internal space S2 is formed by the first housing space S21 and the second housing space S22, and the communication space CS is formed by a space between the first housing portion 52a and the second housing portion 52b. According to this configuration, the space between the first housing portion 52a and the second housing portion 52b of the second container portion 52 in which the pair of rod-shaped extension portions (31,31) are arranged can be used to form the communication space CS communicating to the room temperature bore space BS.

In this case, according the first embodiment, the communication space CS is formed so as to penetrate the second container portion 52 along a direction perpendicular to the axial direction of the superconductor 40. According to this configuration, both ends of the communication space CS are opened to the outside, to thereby allow the communication space CS to be accessed from any one of the end portions of the communication space CS. Therefore, it is possible to further improve the workability at the time of arranging the detection unit in the room temperature bore space BS through the communication space CS.

Further, according to the first embodiment, there is provided a nuclear magnetic resonance apparatus 200 including: the magnetic field generator 100 having the above-mentioned configuration; a detection coil 83, which is arranged in the room temperature bore space BS, and is configured to detect an NMR signal generated when a radio wave is applied to a measurement sample in the room temperature bore space BS under a state in which a static magnetic field is being applied to the room temperature bore space BS; and a tuning circuit 84, which is arranged in the room temperature bore space BS, and is configured to obtain a resonance signal of the NMR signal detected by the detection coil 83.

According to the first embodiment, the detection coil 83 and the tuning circuit 84 are both arranged in the room temperature bore space BS, and hence the distance between the detection coil 83 and the tuning circuit 84 can be shortened. Therefore, it is possible to suppress the deterioration in sensitivity of the NMR signal ascribable to the long distance between the detection coil 83 and the tuning circuit 84.

In this case, according to the first embodiment, the tuning circuit 84 is arranged in a region between: an end portion that is opposite to, out of both end portions of the room temperature bore space BS, an end portion from which a sample tube containing the measurement sample is inserted into the room temperature bore space BS; and a position at which the sample tube is arranged. Further, according to the first embodiments, the tuning circuit 84 is arranged at a position directly below the sample tube. With this configuration, the distance between the detection coil 83 and the tuning circuit 84 can be further shortened. Therefore, it is possible to further suppress the deterioration in sensitivity of the NMR signal ascribable to the long distance between the detection coil 83 and the tuning circuit 84.

Second Embodiment

Next, a magnetic field generator according to a second embodiment is described. The magnetic field generator according to the second embodiment has the same basic configuration as that of the magnetic field generator according to the first embodiment. Therefore, in the following description and the drawings to be referred to, the same reference symbols as those used in the first embodiment are used for the same components as the respective components described in the first embodiment.

Figure 11:
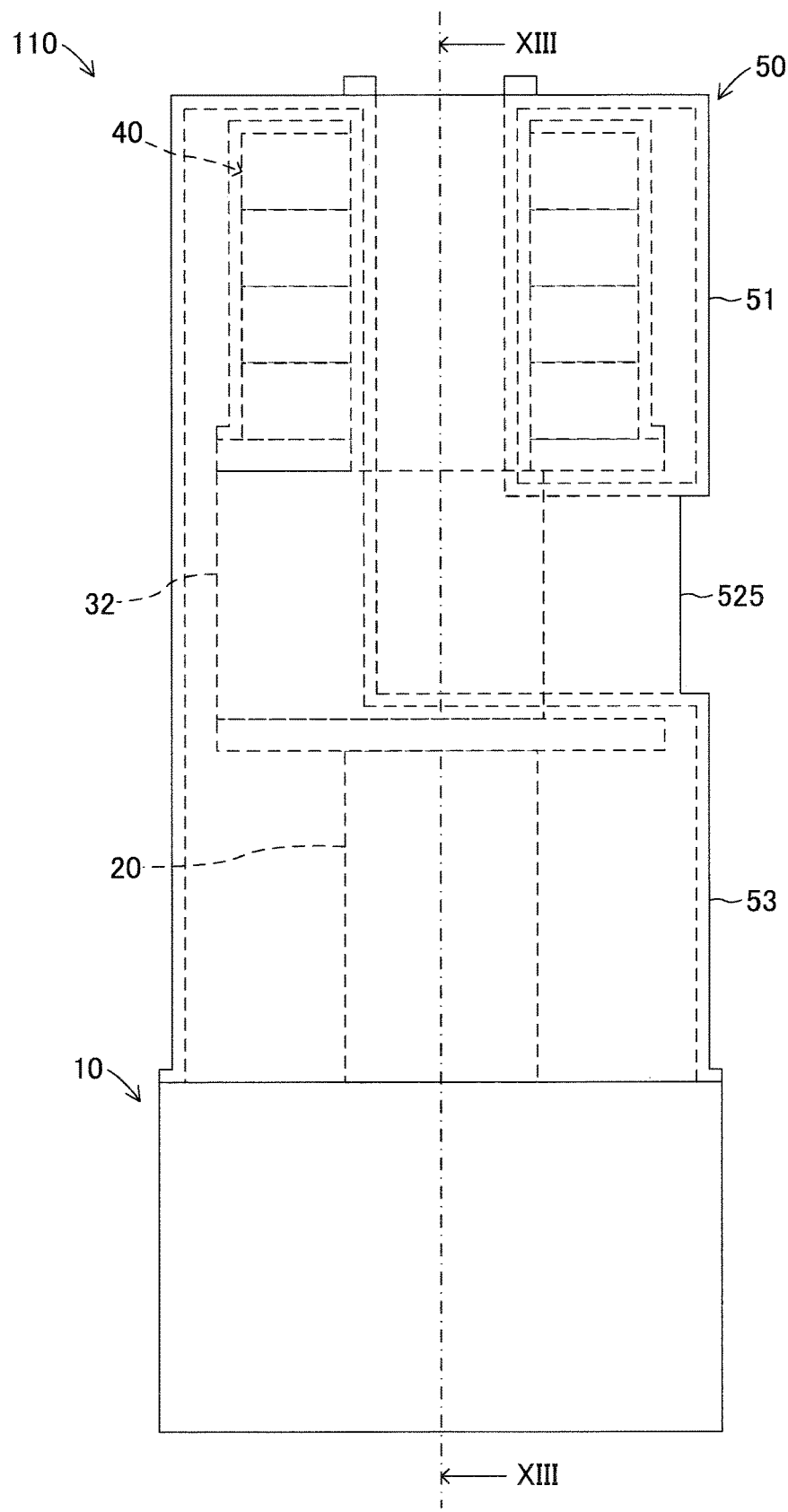
FIG. 11 is a side view of a magnetic field generator according to a second embodiment disclosed here.
Figure 12:
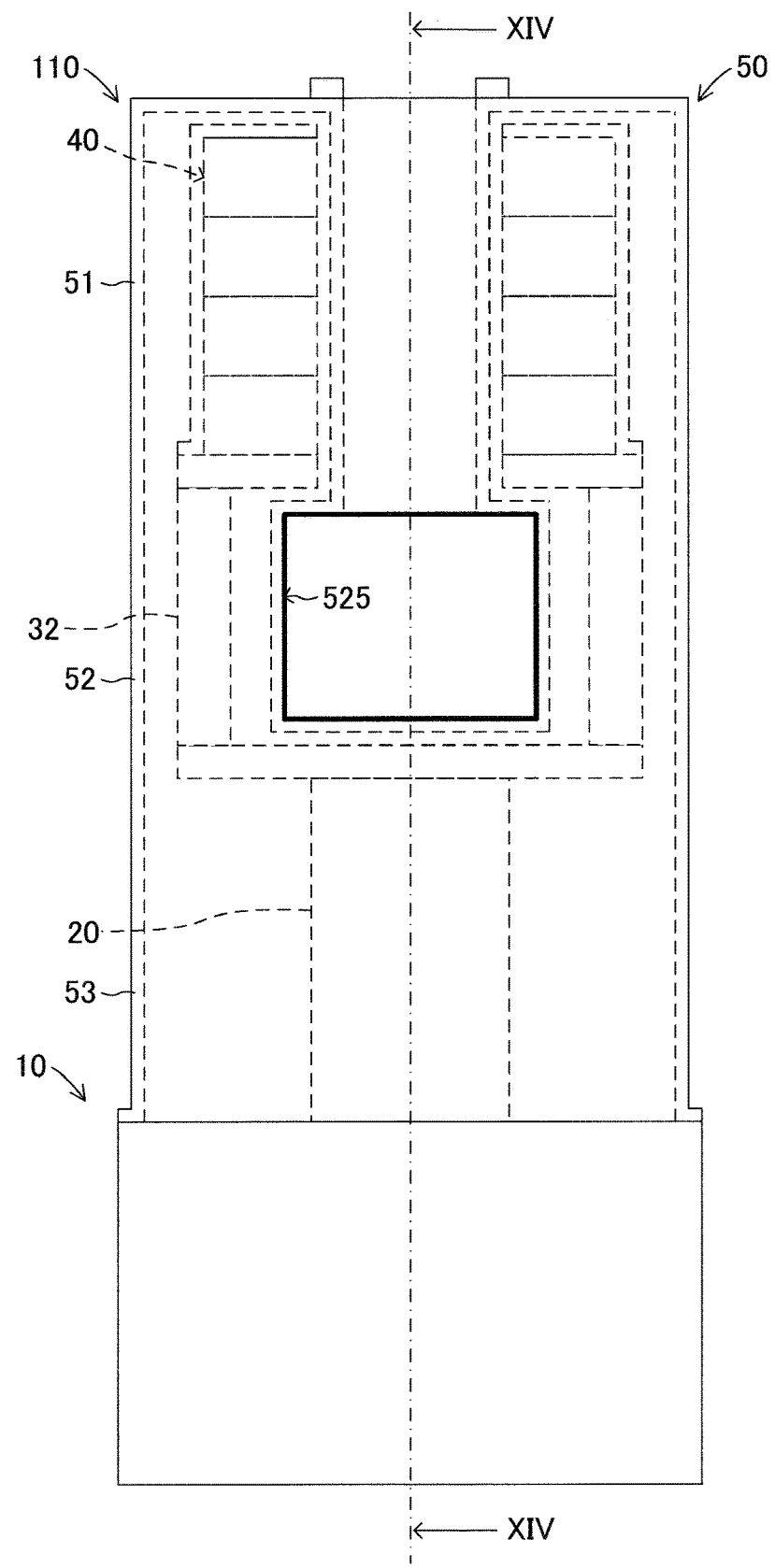
FIG. 12 is a front view of the magnetic field generator according to the second embodiment.
Figure 13:
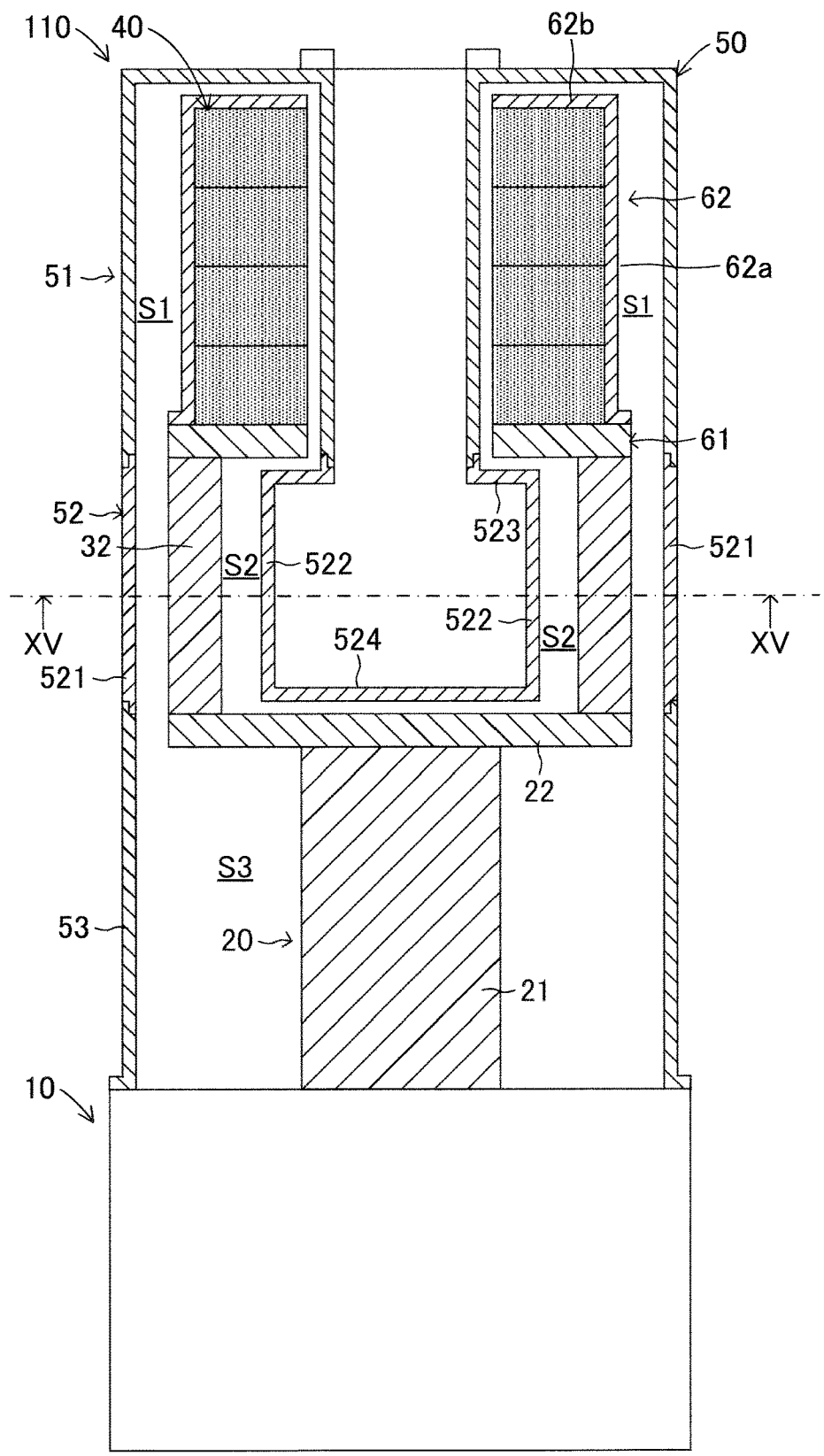
FIG. 13 is a cross-sectional view taken along the line XIII-XIII of FIG. 11.
Figure 14:
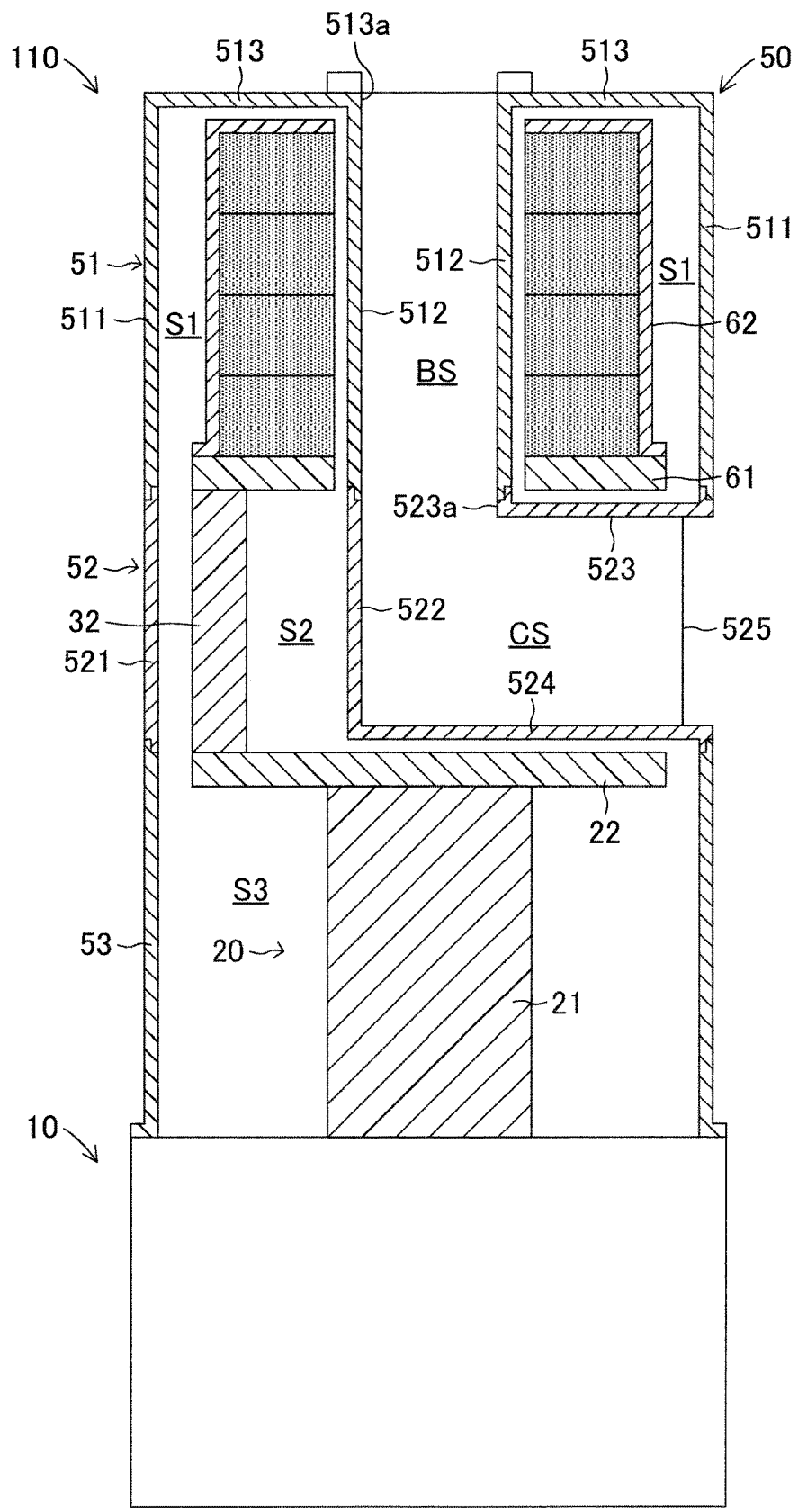
FIG. 14 is a cross-sectional view taken along the line XIV-XIV of FIG. 12.

FIG. 11 is a side view of a magnetic field generator 110 according to the second embodiment, and FIG. 12 is a front view of the magnetic field generator 110. FIG. 13 is a cross-sectional view taken along the line XIII-XIII of FIG. 11, and FIG. 14 is a cross-sectional view taken along the line XIV-XIV of FIG. 12. As illustrated in FIG. 11 to FIG. 14, the magnetic field generator 110 includes the refrigerating machine 10, the cold head 20, a U-shaped extension portion 32, the superconductor 40, and the vacuum heat insulating container 50. The configuration of the refrigerating machine 10 is the same as the configuration of the refrigerating machine according to the first embodiment, and hence a description thereof is omitted.

As illustrated in FIG. 13, the cold head 20 includes the cylindrical portion 21 and the stage portion 22 in the same manner as the cold head 20 in the first embodiment. The cylindrical portion 21 is placed on the upper surface of the refrigerating machine 10, and extends upward from the upper surface of the refrigerating machine 10. The stage portion 22 is provided at the extended end of the cylindrical portion 21. The stage portion 22 is formed in a disc shape whose thickness direction matches the up-down direction.

Figure 15:
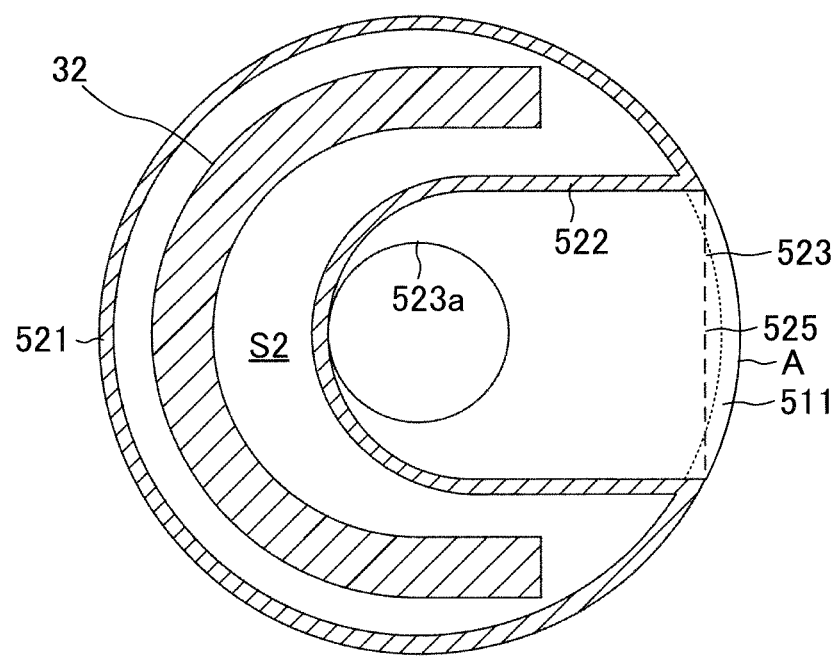
FIG. 15 is a cross-sectional view taken along the line XV-XV of FIG. 14.

The U-shaped extension portion 32 serving as the cold head extension portion is connected onto the stage portion 22 of the cold head 20 formed in a disc shape. The U-shaped extension portion 32 extends upward from the stage portion 22. FIG. 15 is a cross-sectional view taken along the line XV-XV of FIG. 14, and is an illustration of a cross-sectional shape of the U-shaped extension portion 32. As illustrated in FIG. 15, the U-shaped extension portion 32 has a substantially U-shaped cross section.

The upper end of the U-shaped extension portion 32 is connected to the ring-shaped spacer 61 as illustrated in FIG. 13. The cylindrical-shaped superconductor 40 is placed on the upper surface of the ring-shaped spacer 61. Therefore, the U-shaped extension portion 32 extends from the stage portion 22 to be brought into thermal contact with the superconductor 40 via the spacer 61 at its extended end. In addition, the holder 62 is arranged on the superconductor 40 so as to cover the outer peripheral surface and the upper end surface of the superconductor 40. The structures of the superconductor 40, the spacer 61, and the holder 62 in the second embodiment are the same as the structures of the superconductor 40, the spacer 61, and the holder 62 that are described above in the first embodiment, and hence descriptions thereof are omitted.

The vacuum heat insulating container 50 is arranged in the upper part of the refrigerating machine 10 so as to cover the cold head 20, the U-shaped extension portion 32, and the superconductor 40. The contour shape of the vacuum heat insulating container 50 is a cylindrical shape having an axis in the up-down direction in the same manner as the contour shape of the vacuum heat insulating container 50 in the first embodiment. The vacuum heat insulating container 50 has an internal space, and is formed of such a material that can thermally insulate the internal space from the outside. The cold head 20, the U-shaped extension portion 32, and the superconductor 40 are received in the internal space of the vacuum heat insulating container 50 thermally insulated from the outside.

As illustrated in FIG. 13 and FIG. 14, the vacuum heat insulating container 50 includes the first container portion 51, the second container portion 52, and the third container portion 53, and those container portions are provided in the stated order from the top.

The third container 53 is formed in a cylindrical shape, and has its lower end hermetically connected to the upper surface of the refrigerating machine 10, and extends upward from the upper surface of the refrigerating machine 10. The cold head 20 provided on the upper part of the refrigerating machine 10 is arranged in the third internal space S3 being the internal space of the third container portion 53.

The second container portion 52 is provided on the upper part of the third container portion 53. As illustrated in FIG. 13 and FIG. 14, the second container portion 52 includes the outer peripheral wall portion 521, the inner side wall portion 522, the upper wall portion 523, and the bottom wall portion 524.

FIG. 15 is an illustration of cross-sectional shapes of the outer peripheral wall portion 521 and the inner side wall portion 522 of the second container portion 52. As illustrated in FIG. 15, the outer peripheral wall portion 521 has a cylindrical shape having a substantially circular cross section, and has its lower end hermetically connected to the upper end of the third container portion 53 as illustrated in FIG. 13 and FIG. 14. One opening 525 is formed in the outer peripheral wall portion 521. The shape of the opening 525 is a rectangular shape as illustrated in FIG. 12.

As illustrated in FIG. 15, the inner side wall portion 522 is formed in a U-shaped cross section. One end and the other end of the U-shaped inner side wall portion 522 viewed from a direction from which FIG. 15 is illustrated are connected to one end and the other end of the outer peripheral wall portion 521, respectively, which is cut out by the opening 525, namely, both ends of the outer end wall portion 521 in the circumferential direction. Therefore, a closed space is formed by the outer peripheral wall portion 521 and the inner side wall portion 522. The space formed in this manner corresponds to the second internal space S2. The U-shaped extension portion 32 is arranged in the second internal space S2. In addition, as is clear from FIG. 15, the inner side wall portion 522 is formed so as to be curved along the shape of the U-shaped extension portion 32. Therefore, the cross-sectional shape of the second internal space S2 is a crescent shape.

The inner side wall portion 522 extends in the up-down direction, and has its upper side connected to the upper wall portion 523 and has its lower side connected to the bottom wall portion 524. The upper wall portion 523 is provided in a region defined by the upper side of the inner side wall portion 522 and the arc portion (part A in FIG. 15) of the outer peripheral wall portion 521 cut out when the opening 525 is formed. Therefore, as illustrated in FIG. 15, the upper wall portion 523 exhibits a substantially semi-oval shape when viewed from the up-down direction. The circular hole 523a centered on the center axis of the outer peripheral wall portion 521 is formed in the upper wall portion 523. In the same manner as the upper wall portion 523, the bottom wall portion 524 is provided in a region defined by the lower side of the inner side wall portion 522 and the arc portion of the outer peripheral wall portion 521 cut out when the opening 525 is formed, and exhibits a substantially semi-oval shape. The bottom wall portion 524 is hermetically connected to the upper end of the third container portion 53 as illustrated in FIG. 14 at the peripheral edge of the arc portion in which the opening 525 is formed.

As illustrated in FIG. 14, the inner side wall portion 522, the upper wall portion 523, and the bottom wall portion 524 form a space opened to the outside at the opening 525. This space is defined as the communication space CS. In this manner, the communication space CS is formed in the second container portion 52. The cross-sectional shape of the communication space CS is a substantially semi-oval shape in the same manner as the cross-sectional shapes of the upper wall portion 523 and the bottom wall portion 524.

As illustrated in FIG. 14, a first container portion 51 is provided on the upper part of the second container portion 52. The first container portion 51 includes the outer peripheral wall portion 511, the inner peripheral wall portion 512, and the upper wall portion 513. The outer peripheral wall portion 511 is formed in a cylindrical shape, and its lower end is hermetically connected to the upper end of the outer peripheral wall portion 521 of the second container portion 52. A part corresponding to the part in which the opening 525 is formed at the lower end of the outer peripheral wall portion 511 is hermetically connected to the peripheral edge of the upper wall portion 523 of the second container portion 52.

The upper wall portion 513 extends from the upper end of the outer peripheral wall portion 511 of the first container portion 51 to the radially inner side of the outer peripheral wall portion 511. The upper wall portion 513 exhibits a disc shape, and the circular hole 513a is formed at its center. The circular hole 513a is formed so as to be arranged coaxially with the circular hole 523a formed in the upper wall portion 523 of the second container portion 52. The inner peripheral wall portion 512 extends downward from the peripheral edge of the circular hole 513a. The lower end of the inner peripheral wall portion 512 is hermetically connected to the peripheral edge portion of the circular hole 523a formed in the upper wall portion 523 of the second container portion 52.

The first internal space S1 is formed between the outer peripheral wall portion 511 and the inner peripheral wall portion 512 of the first container portion 51. As illustrated in FIG. 13 and FIG. 14, the lower end of the first internal space S1 communicates to the second internal space S2 formed in the second container portion 52. The first internal space S1 is a ring-shaped space, and the spacer 61 and the superconductor 40 are arranged in the first internal space S1. When the superconductor 40 is arranged in the first internal space S1, the outer peripheral wall portion 511 of the first container portion 51 faces the outer peripheral surface of the superconductor 40, and the inner peripheral wall portion 512 of the first container portion 51 faces the inner peripheral surface of the superconductor 40. In addition, the upper end of the first internal space S1 is closed by the upper wall portion 513 of the first container portion 51.

In this manner, the first internal space S1 of the first container portion 51 and the second internal space S2 of the second container portion 52 communicate to each other, and the second internal space S2 of the second container portion 52 and the third internal space S3 of the third container portion 53 communicate to each other. Those spaces communicating to each other form the internal space of the vacuum heat insulating container 50. In the internal space of the vacuum heat insulating container 50, the superconductor 40 is arranged in the first internal space S1 formed in the first container portion 51, the U-shaped extension portion 32 (cold head extension portion) is arranged in the second internal space S2 formed in the second container portion 52, and the cold head 20 is arranged in the third internal space S3 formed in the third container portion 53.

In addition, the room temperature bore space BS is formed by the columnar space on the inner peripheral side of the inner peripheral wall portion 512 of the first container portion 51. The room temperature bore space BS is formed so as to penetrate the first container portion 51 in the up-down direction. The upper end of the room temperature bore space BS is opened to the outside through the circular hole 513a formed in the upper wall portion 513 of the first container portion 51. Meanwhile, the lower end of the room temperature bore space BS communicates to the communication space CS through the circular hole 523a formed in the upper wall portion 523 of the second container portion 52. The room temperature bore space BS and the communication space CS are spaces that are thermally and spatially isolated (partitioned) from the internal space of the vacuum heat insulating container 50.

Figure 16:
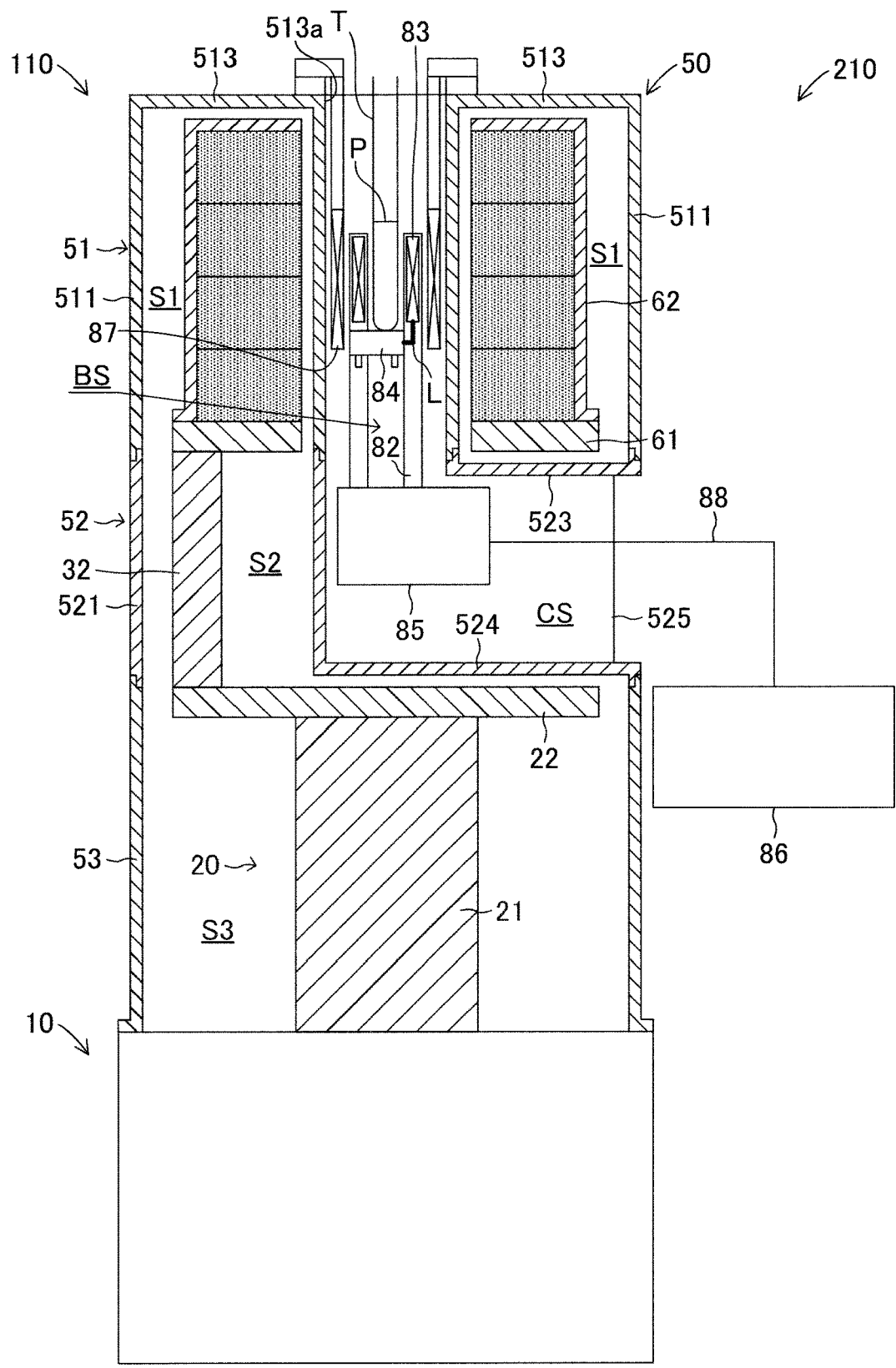
FIG. 16 is a schematic view of a nuclear magnetic resonance apparatus into which the magnetic field generator according to the second embodiment is incorporated.

FIG. 16 is a schematic view of a nuclear magnetic resonance apparatus 210 into which the magnetic field generator 110 is incorporated. FIG. 16 is an illustration of a cross section of the magnetic field generator 110 viewed from a direction from which FIG. 14 is illustrated. As is clear from FIG. 14 and FIG. 16, in the second embodiment as well as in the first embodiment, the room temperature bore space BS, which is opened at its upper end, is formed so as to penetrate the first container portion 51 in the up-down direction, and the lower end of the room temperature bore space BS communicates to the communication space CS. The communication space CS is also opened to the outside through the opening 525. In short, both ends of the room temperature bore space BS communicate to the outside. This allows the room temperature bore space BS to be accessed from the lower end of the room temperature bore space BS, and a required instrument can be inserted into the room temperature bore space BS not only from the upper end side but also from the lower end side. Therefore, when inserting the tuning circuit 84 into the room temperature bore space BS, in order to avoid interfering with the sample tube T, it is possible to insert the tuning circuit 84 into the room temperature bore space BS from the lower end opposite to the upper end from which the sample tube T is inserted. In this case, the tuning circuit 84 is inserted from the lower end into the room temperature bore space BS through the communication space CS. In addition, by inserting the tuning circuit 84 from the lower end side of the room temperature bore space BS, it is possible to arrange the tuning circuit 84 directly below the sample tube T in the room temperature bore space BS. As a result, it is possible to reduce the length of the transmission line L connecting the tuning circuit 84 and the detection coil 83 to each other as much as possible.

In addition, the cold head extension portion in the second embodiment is the U-shaped extension portion 32 having a U-shaped cross section. The cold head extension portion having a U-shaped cross section is thus used, to thereby be able to increase a heat transfer area. Therefore, the superconductor 40 can be efficiently cooled, and a temperature difference inside the superconductor 40 can be reduced. As a result, a uniform magnetic field space can be generated by the superconductor 40.

Third Embodiment

Figure 17:
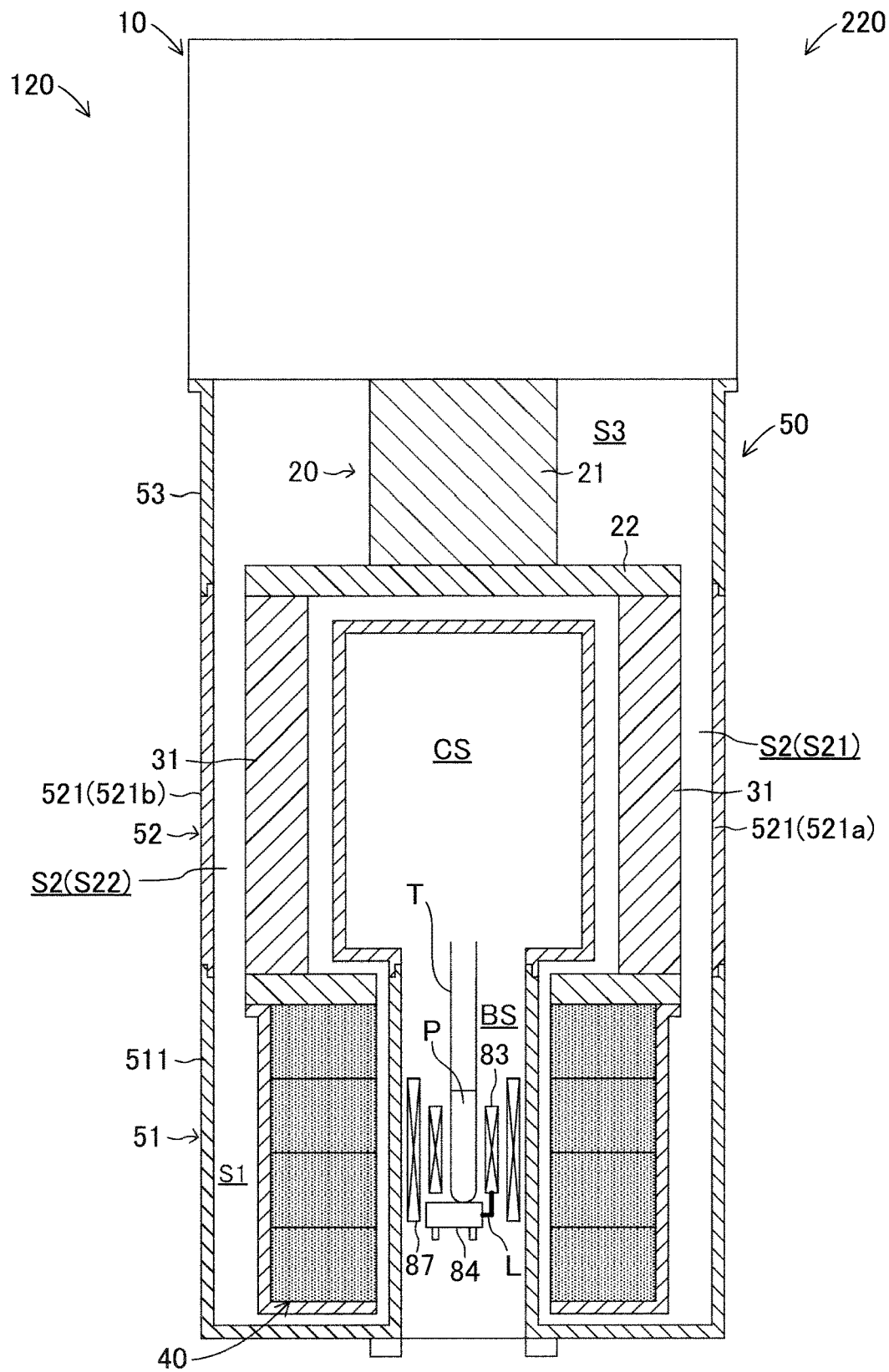
FIG. 17 is a schematic view of a nuclear magnetic resonance apparatus into which the magnetic field generator according to a third embodiment is incorporated.

FIG. 17 is a schematic view of a nuclear magnetic resonance apparatus 220 into which a magnetic field generator 120 according to a third embodiment is incorporated. In FIG. 17, an analysis device for the nuclear magnetic resonance apparatus is omitted. The magnetic field generator 120 according to the third embodiment is configured by arranging the magnetic field generator 100 according to the first embodiment upside down. In this case, the refrigerating machine 10 is arranged on the top, the cold head 20 is arranged below the refrigerating machine 10, the cold head extension portion (rod-shaped extension portions 31) is arranged below the cold head 20, and the superconductor 40 is arranged below the cold head extension portion (rod-shaped extension portion 31). In the same manner as in the first embodiment, the vacuum heat insulating container 50 includes the first container portion 51, the second container portion 52, and the third container portion 53, but the third container portion 53 is located on the top, the second container portion 52 is provided below the third container portion 53, and the first container portion 51 is provided below the second container portion 52. The structure of each component of the magnetic field generator 120 is the same as the structure of each component of the magnetic field generator 100 according to the first embodiment except that the structures are upside down, and hence a description thereof is omitted.

In the first embodiment and the second embodiment described above, the communication space CS is located below the room temperature bore space BS, while in the third embodiment, the communication space CS is located above the room temperature bore space BS. In this case, the sample tube T containing the measurement sample P is inserted into the room temperature bore space BS from its upper end through the communication space CS, and is arranged at a desired position in the room temperature bore space BS. Meanwhile, the room temperature shim coil 87, the detection coil 83, and the tuning circuit 84 are inserted into the room temperature bore space BS through the opening at the lower end of the room temperature bore space BS. The detection coil 83 is arranged around the outer periphery of the sample tube T, and the tuning circuit 84 is arranged directly below the sample tube T. Even with such a configuration, the tuning circuit 84 can be arranged in the room temperature bore space BS. The tuning circuit 84 can also be arranged directly below the sample tube T in the room temperature bore space BS, and hence it is possible to reduce the length of the transmission line L connecting the detection coil 83 and the tuning circuit 84. As a result, it is possible to suppress a decrease in sensitivity of the NMR signal due to an increase in length of the transmission line L.

When the magnetic field generator is configured as described in the third embodiment, the sample tube T is inserted into the room temperature bore space BS through the communication space CS. In this case, as illustrated in FIG. 17, the length of the communication space CS in the up-down direction is preferred to be longer than the length of the sample tube T in the longitudinal direction. By forming the communication space CS in this manner, it is possible to insert the sample tube T into the room temperature bore space BS through the communication space CS without tilting the sample tube T. Therefore, it is possible to improve the installation workability of the sample tube T.

In addition, when the magnetic field generator is configured as described in the third embodiment, a low-temperature generator of the refrigerating machine 10 is located below the refrigerating machine 10. In this case, it is possible to suitably use a refrigerating machine in which the low-temperature generator is located in its lower part, for example, a pulse tube refrigerating machine.

While the embodiments and the modification examples have been described above, the examples described above merely describe embodied examples for carrying out the present invention. Therefore, the present invention should not be interpreted as being limited to those exemplary examples described above. The present invention can be carried out in various modes without departing from the technical ideas or main features of the present invention.

What is claimed is:

1. A magnetic field generator, comprising:
a refrigerating machine configured to generate cooling energy;
a cold head, through which the cooling energy generated by the refrigerating machine is to be transmitted;
a superconductor, which is formed in a cylindrical shape, and is configured to generate a magnetic field by capturing a magnetic field under a state in which the superconductor has been cooled to a temperature equal to or lower than a superconducting transition temperature;
a cold head extension portion, which extends from the cold head, and is brought into thermal contact with the superconductor at an extended end of the cold head extension portion; and
a vacuum heat insulating container having an internal space in which the cold head, the cold head extension portion, and the superconductor are received, the vacuum heat insulating container including a first container portion having formed therein a first internal space in which the superconductor is arranged,
wherein the superconductor has a room temperature bore space formed on an inner peripheral side of the superconductor along an axial direction of the superconductor, the room temperature bore space being spatially isolated from the internal space, and
wherein the room temperature bore space has both ends communicating to an outside of the magnetic field generator, and
wherein the room temperature bore space is formed so as to be opened to the outside at one end of the room temperature bore space, to extend in the axial direction of the superconductor, and to penetrate the first container portion.

2. The magnetic field generator according to claim 1, wherein the vacuum heat insulating container includes:
a second container portion having formed therein a second internal space in which the cold head extension portion is arranged, the second internal space communicating to the first internal space; and
a third container portion having formed therein a third internal space in which the cold head is arranged, the third internal space communicating to the second internal space,
wherein the first container portion includes:
an outer peripheral wall portion, which faces an outer peripheral surface of the superconductor; and
an inner peripheral wall portion, which faces an inner peripheral surface of the superconductor,
wherein the first internal space is formed by a space surrounded by the outer peripheral wall portion and the inner peripheral wall portion,
wherein the room temperature bore space is formed by a space on an inner peripheral side of the inner peripheral wall portion, and
wherein the second container portion has formed therein a communication space, which is opened to the outside, and communicates to another end of the room temperature bore space.

3. The magnetic field generator according to claim 2, wherein the communication space is formed so that a cross-sectional area of the communication space perpendicular to the axial direction of the superconductor is larger than a cross-sectional area of the room temperature bore space perpendicular to the axial direction of the superconductor.

4. The magnetic field generator according to claim 2, wherein the cold head extension portion includes a pair of rod-shaped extension portions, which extend from the cold head in parallel with each other,
wherein the second container portion includes:
a first housing portion having formed therein a first housing space in which one of the pair of rod-shaped extension portions is received; and
a second housing portion having formed therein a second housing space in which another one of the pair of rod-shaped extension portions is received,
wherein the second internal space is formed by the first housing space and the second housing space, and
wherein the communication space is formed by a space between the first housing portion and the second housing portion.

5. The magnetic field generator according to claim 4, wherein the communication space is formed so as to penetrate the second container portion along a direction perpendicular to the axial direction of the superconductor.

6. A nuclear magnetic resonance apparatus, comprising:
a magnetic field generator, comprising:
a refrigerating machine configured to generate cooling energy;
a cold head, through which the cooling energy generated by the refrigerating machine is to be transmitted;
a superconductor, which is formed in a cylindrical shape, and is configured to generate a magnetic field by capturing a magnetic field under a state in which the superconductor has been cooled to a temperature equal to or lower than a superconducting transition temperature;
a cold head extension portion, which extends from the cold head, and is brought into thermal contact with the superconductor at an extended end of the cold head extension portion; and
a vacuum heat insulating container having an internal space in which the cold head, the cold head extension portion, and the superconductor are received,
wherein the superconductor has a room temperature bore space formed on an inner peripheral side of the superconductor along an axial direction of the superconductor, the room temperature bore space being spatially isolated from the internal space, and
wherein the room temperature bore space has both ends communicating to an outside of the magnetic field generator;
a detection coil, which is arranged in the room temperature bore space, and is configured to detect an NMR signal generated when a radio wave is applied to a measurement sample in the room temperature bore space under a state in which a static magnetic field is being applied to the room temperature bore space; and a tuning circuit, which is arranged in the room temperature bore space, and is configured to obtain a resonance signal of the NMR signal detected by the detection coil.

7. The nuclear magnetic resonance apparatus according to claim 6, wherein the tuning circuit is arranged in a region between: an end portion that is opposite to, out of both end portions of the room temperature bore space, an end portion from which a sample tube containing the measurement sample is inserted into the room temperature bore space; and a position at which the sample tube is arranged.

\* \* \* \* \*